(12) United States Patent
Koike et al.

(10) Patent No.: US 8,138,533 B2
(45) Date of Patent: Mar. 20, 2012

(54) SEMICONDUCTOR DEVICE WITH AN ELECTRODE AS AN ALIGNMENT MARK, AND METHOD OF MANUFACTURING THE SAME

(75) Inventors: Hidetoshi Koike, Yokohama (JP); Yusuke Kohyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 12/638,381

(22) Filed: Dec. 15, 2009

(65) Prior Publication Data
US 2010/0155796 A1    Jun. 24, 2010

(30) Foreign Application Priority Data
Dec. 18, 2008  (JP) ................................. 2008-322519

(51) Int. Cl.
*H01L 31/14*    (2006.01)

(52) U.S. Cl. ................... 257/292; 257/E31.097

(58) Field of Classification Search .................. 257/292, 257/369, 347, 293–294, 433, 437, E31.097
See application file for complete search history.

(56) References Cited

U.S. PATENT DOCUMENTS

| | | | |
|---|---|---|---|
| 6,392,300 B1 | 5/2002 | Koike | |
| 6,989,560 B2 | 1/2006 | Koike et al. | |
| 2006/0076590 A1* | 4/2006 | Pain et al. | 257/294 |
| 2007/0117254 A1* | 5/2007 | Pain | 438/75 |
| 2008/0203516 A1* | 8/2008 | Shin | 257/444 |
| 2009/0014762 A1 | 1/2009 | Matsuo et al. | |
| 2009/0146325 A1* | 6/2009 | Liu et al. | 257/797 |
| 2009/0317933 A1* | 12/2009 | Park et al. | 438/70 |
| 2009/0321888 A1* | 12/2009 | Liu et al. | 257/618 |
| 2010/0051906 A1* | 3/2010 | Yamauchi et al. | 257/21 |
| 2010/0055823 A1* | 3/2010 | Kim et al. | 438/70 |
| 2010/0237452 A1* | 9/2010 | Hagiwara et al. | 257/432 |
| 2010/0323470 A1* | 12/2010 | Venezia et al. | 438/72 |
| 2011/0058062 A1* | 3/2011 | Maruyama et al. | 348/222.1 |

FOREIGN PATENT DOCUMENTS

JP    2007-324629    12/2007

* cited by examiner

*Primary Examiner* — Nathan Ha
(74) *Attorney, Agent, or Firm* — Oblon, Spivak, McClelland, Maier & Neustadt, L.L.P.

(57) ABSTRACT

A semiconductor device includes a semiconductor substrate, a back side drawn electrode formed by embedding a first conductive material in a contact hole penetrating the semiconductor substrate through an insulating film formed to include a uniform thickness, used also as an alignment mark, and configured to draw out an electrode to the back side of the semiconductor substrate. The device further includes a pad provided on the back side of the semiconductor substrate, and connected to the back side drawn electrode.

15 Claims, 35 Drawing Sheets

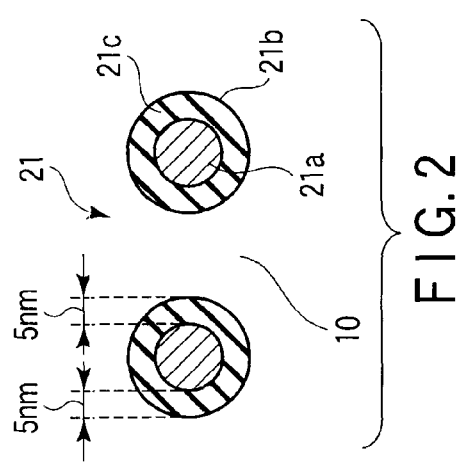
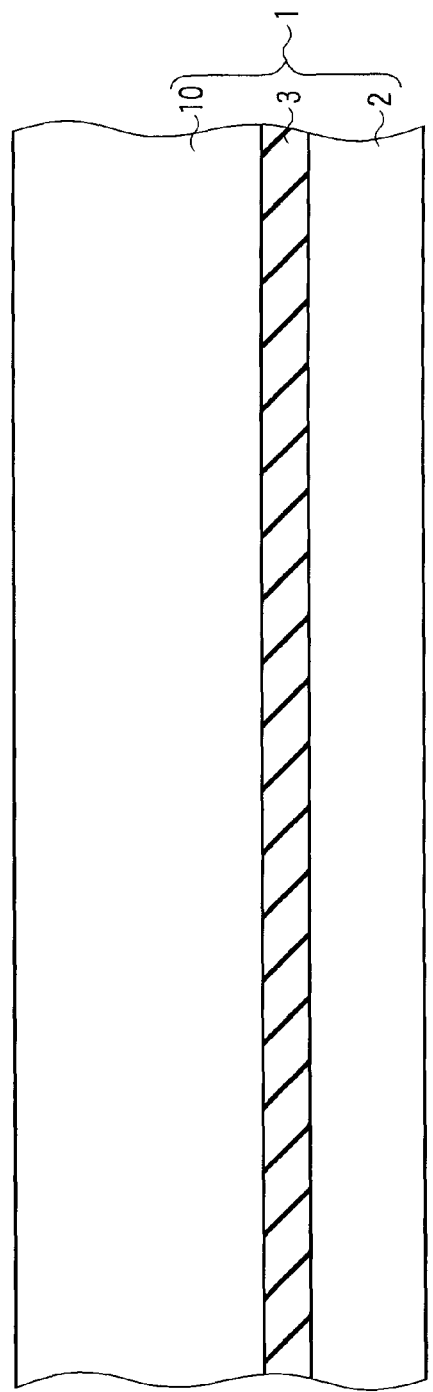
FIG. 2
FIG. 3

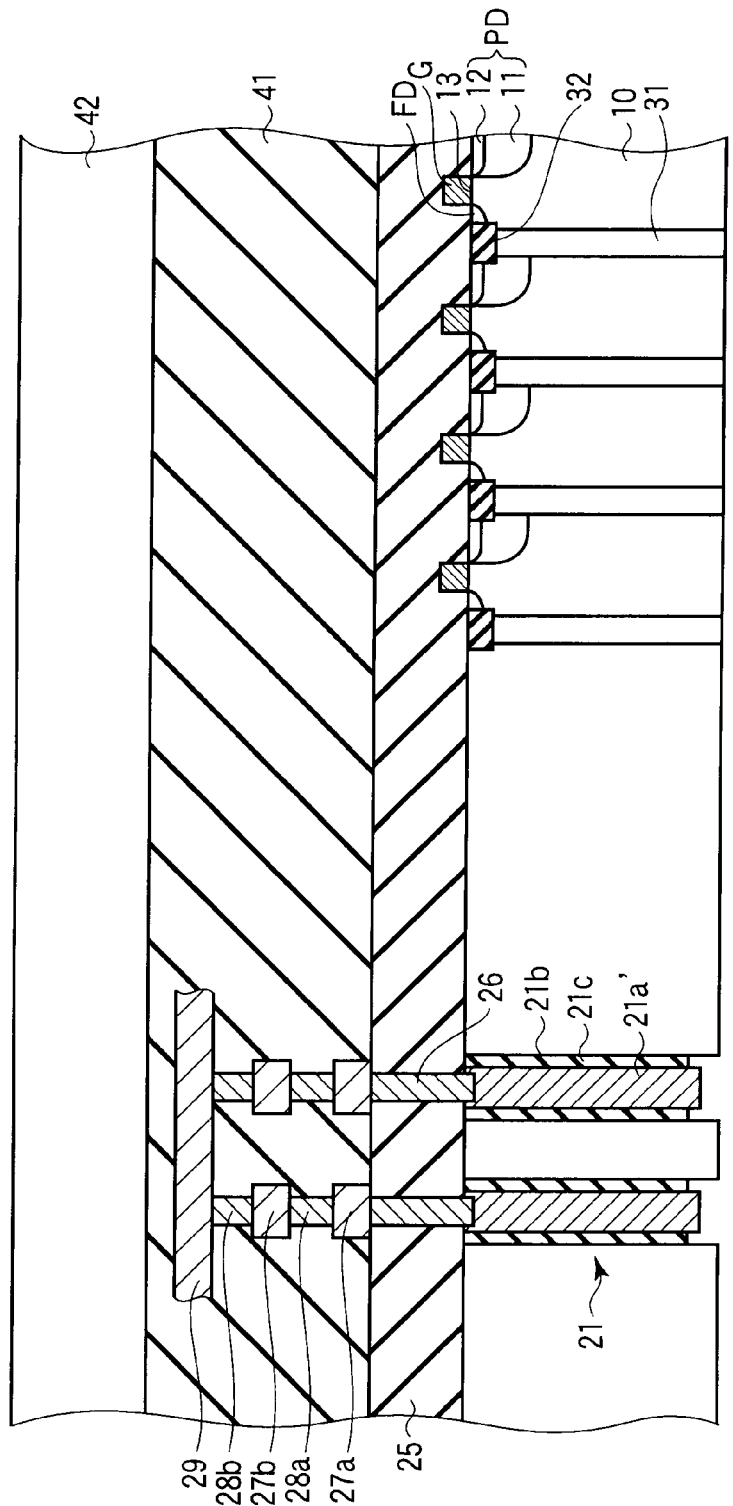
F I G. 24

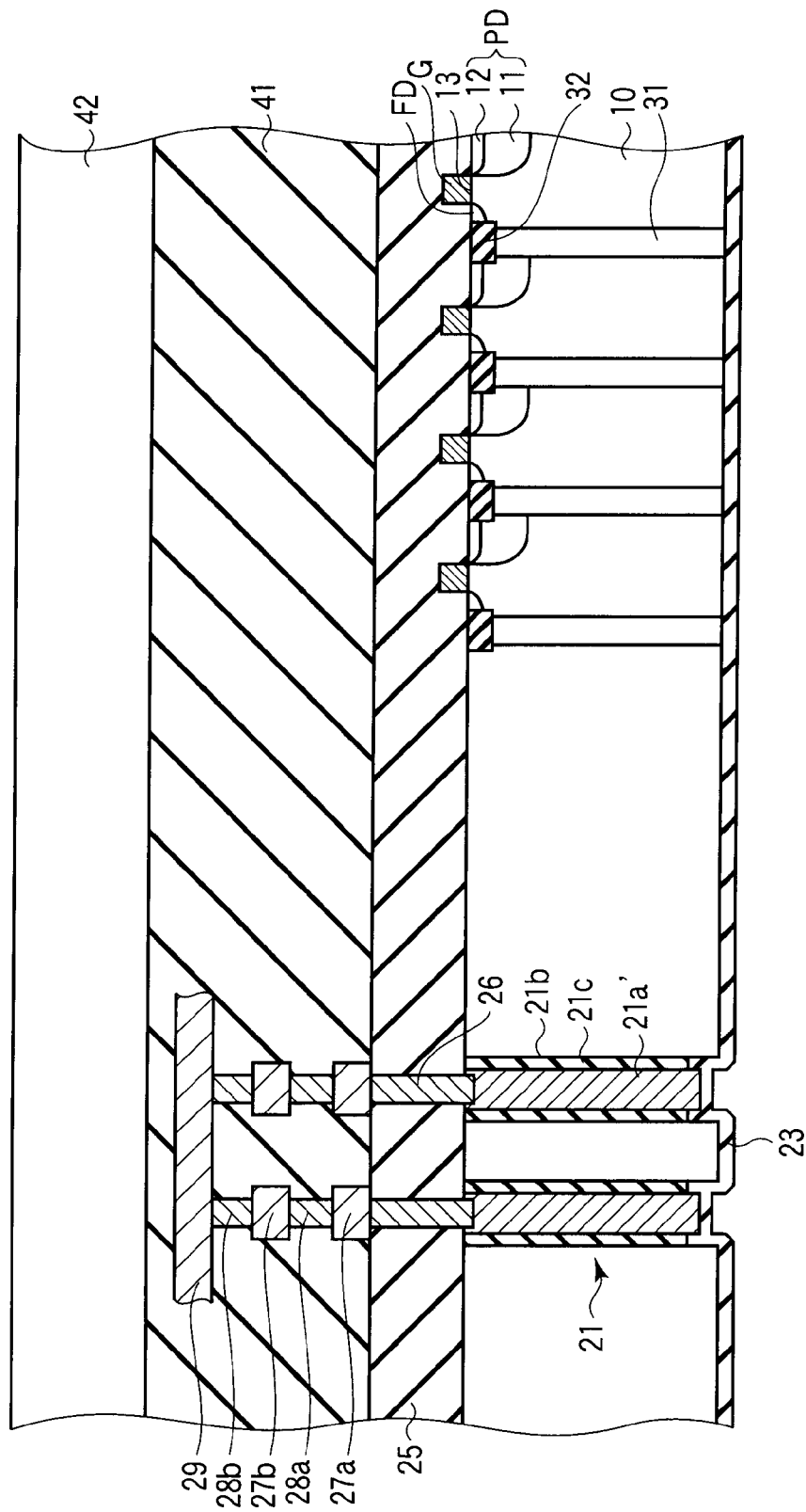
F I G. 25

SEMICONDUCTOR DEVICE WITH AN ELECTRODE AS AN ALIGNMENT MARK, AND METHOD OF MANUFACTURING THE SAME

CROSS-REFERENCE TO RELATED APPLICATIONS

This application is based upon and claims the benefit of priority from prior Japanese Patent Application No. 2008-322519, filed Dec. 18, 2008, the entire contents of which are incorporated herein by reference.

BACKGROUND OF THE INVENTION

1. Field of the Invention

The present invention relates to a semiconductor device and method of manufacturing the same.

2. Description of the Related Art

A CMOS image sensor is known as a solid-state image sensing device used for a portable camera module, video camera, digital still camera, surveillance camera or the like. Regarding the CMOS image sensor, a back side illumination structure is proposed for the purpose of improving the pixel performance such as sensitivity or the like (see, for example, Pat. Document 1: Jpn. Pat. Appln. KOKAI Publication No. 2007-324629). That is, the back side illumination structure is configured to improve the light condensing characteristic by making light incident on the back side of a substrate on which neither an electrode layer nor a wiring layer is arranged.

BRIEF SUMMARY OF THE INVENTION

A semiconductor device according to an aspect of the present invention comprising a semiconductor substrate, a back side drawn electrode formed by embedding a first conductive material in a contact hole penetrating the semiconductor substrate through an insulating film formed to include a uniform thickness, used also as an alignment mark, and configured to draw out an electrode to the back side of the semiconductor substrate, and a pad provided on the back side of the semiconductor substrate, and connected to the back side drawn electrode.

A method of manufacturing a semiconductor device configured to form a back side drawn electrode which is used to draw out an electrode used also as an alignment mark to the back side of a semiconductor substrate according to an aspect of the present invention comprising forming a through hole in the semiconductor substrate, forming an insulating film with a uniform thickness on an inner wall of the through hole, and embedding a first conductive material in the through hole through the insulating film to thereby form a contact layer.

BRIEF DESCRIPTION OF THE SEVERAL VIEWS OF THE DRAWING

FIG. 2 is a plan view showing a configuration example of a back side drawn electrode of the CMOS image sensor according to the first embodiment;

FIG. 3 is a process cross-sectional view shown to explain a method of manufacturing the CMOS image sensor according to the first embodiment;

FIG. 24 is a process cross-sectional view shown to explain the method of manufacturing the CMOS image sensor according to the second embodiment;

FIG. 25 is a process cross-sectional view shown to explain the method of manufacturing the CMOS image sensor according to the second embodiment;

DETAILED DESCRIPTION OF THE INVENTION

Figure 1:
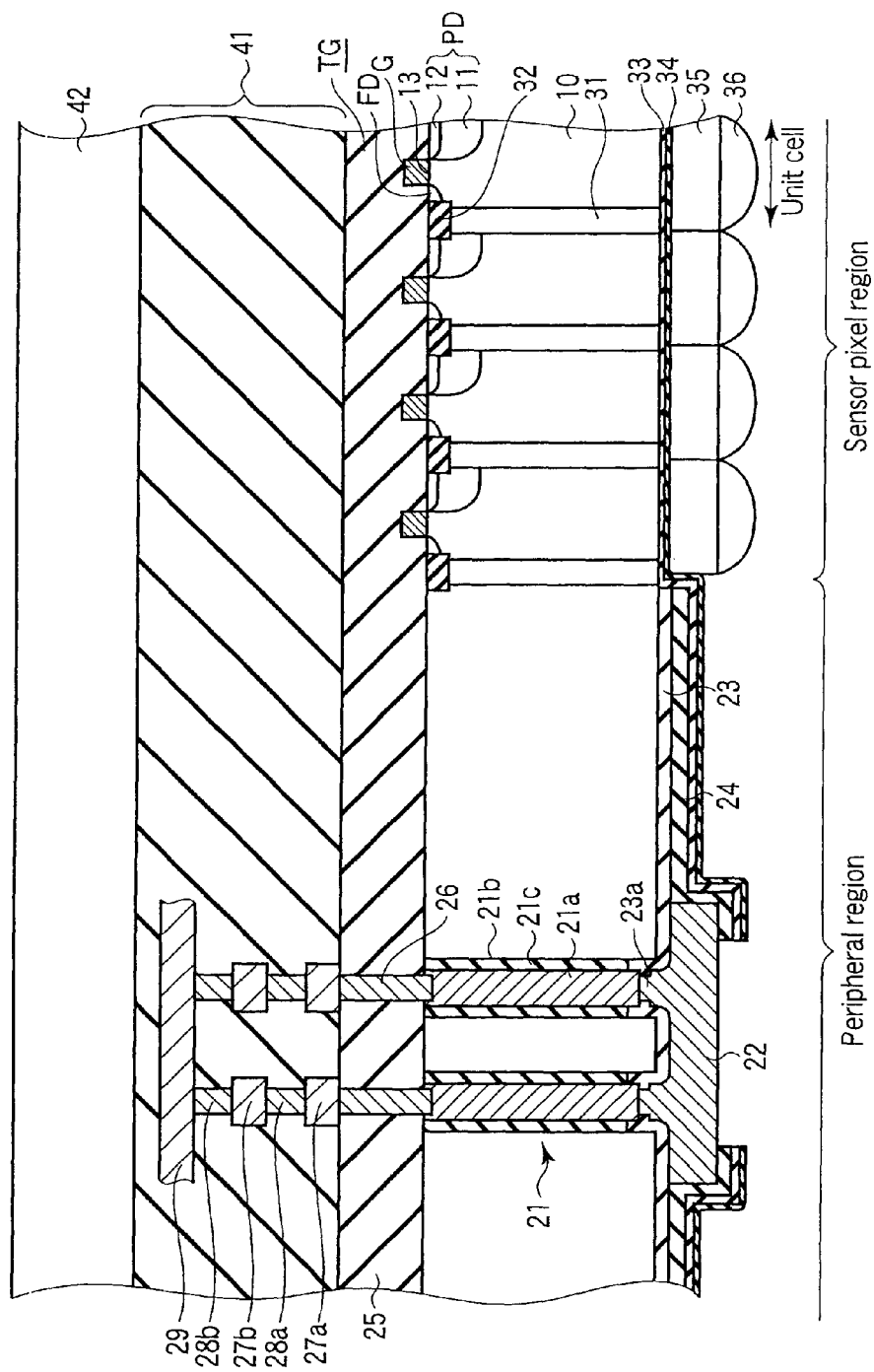
FIG. 1 is a cross-sectional view showing a configuration example of a semiconductor device (back side illumination CMOS image sensor) according to a first embodiment of the present invention.

Here, in the case of the back side illumination solid-state image sensing device described in Pat. Document 1, it is necessary to draw out an electrode to the back side of the substrate.

However, the process of drawing out the electrode is a process separate from a process of forming an alignment mark used for alignment of a photodiode of a light-receiving sensor section and an on-chip lens with each other, and hence the number of steps tends to increase. That is, in the case of the back side illumination solid-state image sensing device, first, when the light-receiving sensor section, electrode layer, and the like are formed on the surface side of the substrate, an alignment mark is formed by embedding an insulating layer in a contact hole. Thereafter, when the on-chip lens is formed on the back side of the substrate, the insulating layer of the alignment mark is hollowed out, whereby a contact layer used to draw out the electrode to the back side of the substrate is formed. As described above, in the back side illumination solid-state image sensing device, it is necessary to remodel the alignment mark formed as an alignment mark into a back side drawn electrode connected to the electrode layer and wiring layer, and hence the number of steps has been increased correspondingly as compared with the surface side illumination structure. Accordingly, a process in which the number of steps can be reduced has been strongly demanded.

Further, the structure of Pat. Document 1 in which the alignment mark is remodeled into the back side drawn electrode is unsuitable for miniaturization, and tends to be unfit for size reduction of the device. This is due to the following reason. The inner part of the insulating layer serving as the alignment mark is hollowed out in such a manner that only the outer part thereof remains, then the hollowed inner part is filled with a conductive material to thereby form a contact layer, and the contact layer is used as the back side drawn electrode. Accordingly, in consideration of the positional alignment accuracy and the like, it is difficult to form the insulating layer at a uniform film thickness, and there is a limit to the miniaturization.

Thus, an embodiment of the present invention will be described below with reference to the drawings. However, it should be noted that the drawings are schematic, and the dimensions and ratios in the drawings are different from the actual dimensions and ratios. Further, it goes without saying that in the drawings, different dimensional relationships and/or ratios may be included. Particularly, several embodiments shown below exemplify devices and methods configured to embody the technical idea of the present invention, and the technical idea of the present invention is not specified by the shapes, structures, and arrangements of the component parts. The technical idea of the present invention may be variously changed within the scope not deviating from the gist of the invention.

First Embodiment

FIG. 1 shows a configuration example of a semiconductor device according to a first embodiment of the present invention. Here, a back side illumination CMOS image sensor will be described below as an example of the semiconductor device. It should be noted that FIG. 1 shows an example of a case where a unit cell is of a three transistor (3Tr) type with a one pixel/one cell structure.

As shown in FIG. 1, in the case of the back side illumination CMOS image sensor, one unit cell is constituted of a photodiode section PD, transfer (readout) MOS transistor TG, and reset MOS transistor and amplification MOS transistor which are not shown in FIG. 1. In the back side illumination CMOS image sensor, a plurality of unit cells each configured as described above are arranged in a matrix form.

That is, in each unit cell, the photodiode section PD is constituted of a light-receiving section 11 and accumulation layer 12. The light-receiving section 11 is a charge-accumulation region configured to accumulate signal charges obtained by subjecting incident light to photoelectric conversion, and is constituted of, for example, a diffusion layer of the N conduction type (first conduction type) formed in the surface part (sensor pixel area) of a silicon (Si) epitaxial layer 10 in a silicon on insulator (SOI) substrate. The accumulation layer 12 is used to suppress a dark current, and is, for example, a diffusion layer region (P-layer) of low impurity concentration with the P conduction type (second conduction type) provided to correspond to the surface part of the light receiving section 11. The impurity concentration of the accumulation layer 12 is, for example, about $1 \times 10^{16}$ to $1 \times 10^{17}$.

The transfer MOS transistor TG is used to control accumulation of signal charges at the photodiode section PD, and is provided adjacent to the photodiode section PD. That is, a readout gate electrode (readout electrode) G of the transfer MOS transistor TG is formed on the surface of the Si epitaxial layer 10 through an insulating film 13. Polysilicon or the like is used to form the readout gate electrode G. A drain functions as an anode of the photodiode section PD, and source functions as the floating diffusion FD. The floating diffusion FD is a diffusion layer region (N+ layer) of high impurity concentration formed in the surface part of the Si epitaxial layer 10.

It should be noted that a reference symbol 31 shown in FIG. 1 denotes a pixel separation region (P layer) used to demarcate the unit cell, and reference symbol 32 denotes the shallow trench isolation (STI) for pixel separation. Further, although not shown for convenience' sake, in each unit cell, a reset MOS transistor and amplification MOS transistor are provided on the surface side (another cross section) of the Si epitaxial layer 10.

In the case of the back side illumination CMOS image sensor, the incident light is irradiated from the back side of the Si epitaxial layer 10, is transmitted through the Si epitaxial layer 10, and is then received by the photodiode section PD. At this time, the incident light is made to enter the Si epitaxial layer 10 without being interrupted by a plurality of wiring layers, and is guided to the photodiode section PD. Accordingly, on the back side (back side of the sensor) of the Si epitaxial layer 10, a color filter 35 of RGB (red, green or blue), and microlens 36 are provided to each unit cell through a passivation oxide film 33, and passivation nitride film 34.

On the other hand, back side drawn electrodes 21 are provided in the peripheral region of the Si epitaxial layer 10. The back side drawn electrode 21 functions also as, for example, an alignment mark used for alignment of the photodiode section PD of the sensor pixel region and microlens 36 with each other. That is, in the peripheral region of the sensor, a contact layer 21a, and insulating film 21c which serve as an alignment mark are provided to penetrate the Si epitaxial layer 10. The contact layer 21a is configured by embedding, for example, low resistance polysilicon to which a proper amount of impurities is added in a contact hole (deep trench) 21b formed in the Si epitaxial layer 10 through a thin insulating film 21c with a substantially uniform film thickness (via hole structure).

One end of the contact layer 21a is connected to an aluminum (Al) pad 22 provided on the back side (back side of the sensor) of the Si epitaxial layer 10. The Al pad 22 is connected to the one end of the contact layer 21a through a back side contact section 23a of a back side insulating film 23. The Al pad 22 is considerably covered with a passivation insulating film 24, the passivation oxide film 33, and passivation nitride film 34, and only a surface part thereof is exposed.

Further, on the surface side of the Si epitaxial layer 10, the other end of the contact layer 21a is connected to a wiring layer contact 26 provided in an interlayer insulating film 25. The wiring layer contact 26 is connected to a wiring layer (or electrode layer) 29 constituted of aluminum through first layer wiring 27a constituted of copper (Cu), a first layer via 28a constituted of copper, second layer wiring 27b constituted of copper, and second layer via 28b constituted of copper. In this way, the wiring layer or electrode layer connected to the transfer MOS transistor TG or the like is drawn out to the back side of the sensor (Si epitaxial layer 10) through the back side drawn electrode 21.

Further, a support substrate 42 is joined to a part above (on the surface side of the sensor) the wiring layer 29 through an insulating film layer 41.

In the case of the configuration of this embodiment, by employing the back side illumination structure, it becomes possible not only to improve the light condensing characteristic of the CMOS image sensor, but also to utilize the alignment mark also as a back side drawn electrode 21 as it is, and hence it becomes possible to simplify the manufacturing process, and form the alignment mark more minute. As a result of this, downsizing of the sensor is enabled.

FIG. 2 shows a configuration example of the back side drawn electrode 21. In the case of this embodiment, in the back side drawn electrode 21, it becomes possible to form an insulating film 21c by a thin oxide ($SiO_2$) film with a substantially uniform film thickness.

That is, although details will be described later, an insulating film 21c constituted of an $SiO_2$ film is formed on an inner wall of a contact hole 21b by, for example, oxidizing the Si epitaxial layer 10, and thereafter low resistance polysilicon is embedded in the contact hole 21b to form a contact layer 21a, whereby a back side drawn electrode 21 doubling as an alignment mark is formed. Accordingly, it becomes possible not only to reduce the number of steps, but also to form a thin insulating film 21c with a substantially uniform film thickness. Thus, it becomes possible to form a more minute alignment mark than that in the back side illumination solid-state image sensing device described in Pat. Document 1 explained previously.

Here, assuming that, for example, the working voltage of the sensor is 3.3 V, the minimum film thickness of an insulating film 21c used to insulate the contact layer 21a and Si epitaxial layer 10 from each other becomes about 5 nm (the insulating film thickness for each alignment mark is about 10 nm before and after the processing).

Incidentally, in the case of the back side illumination solid-state image sensing device described in Pat. Document 1, in view of the accuracy (for example, 15 nm) of processing of hollowing out the insulating layer, and alignment accuracy (for example, 25 nm), a thickness of 50 nm or more (for each alignment mark before processing) becomes necessary for the insulating layer even under the same conditions (working voltage VDD=3.3 V, minimum film thickness=5 nm).

A method of manufacturing a back side illumination CMOS image sensor will be described below. It should be noted that here the case where an SOI substrate is used to form a back side drawn electrode constituted of polysilicon is shown as an example.

First, as shown in, for example, FIG. 3, an SOI substrate 1 is prepared. The SOI substrate 1 includes a Si substrate 2, embedded oxide film 3, and Si epitaxial layer 10.

Figure 4:
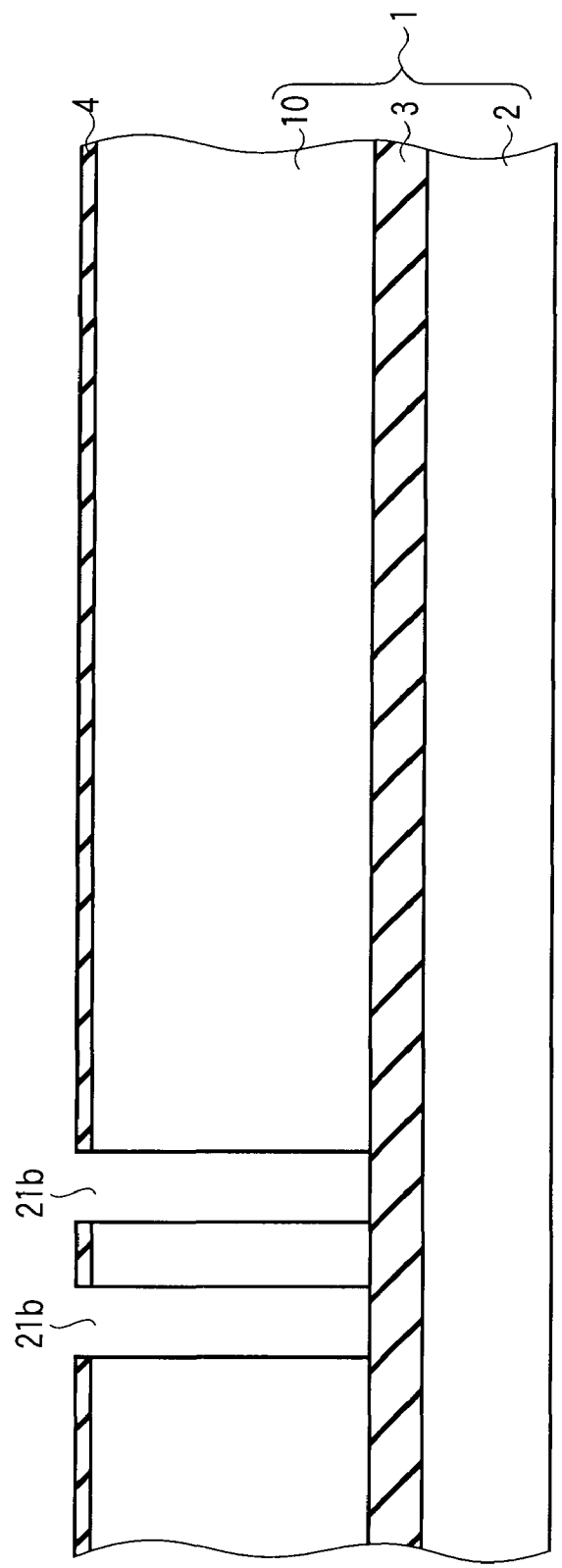
FIG. 4 is a process cross-sectional view shown to explain the method of manufacturing the CMOS image sensor according to the first embodiment.

Then, as shown in, for example, FIG. 4, a stopper film 4 such as nitride (SiN) is deposited on the surface of the Si epitaxial layer 10, and thereafter contact holes (through via holes) 21b penetrating the Si epitaxial layer 10, and reaching the embedded oxide film 3 are formed in the peripheral region by a known photolithographic process.

Figure 5:
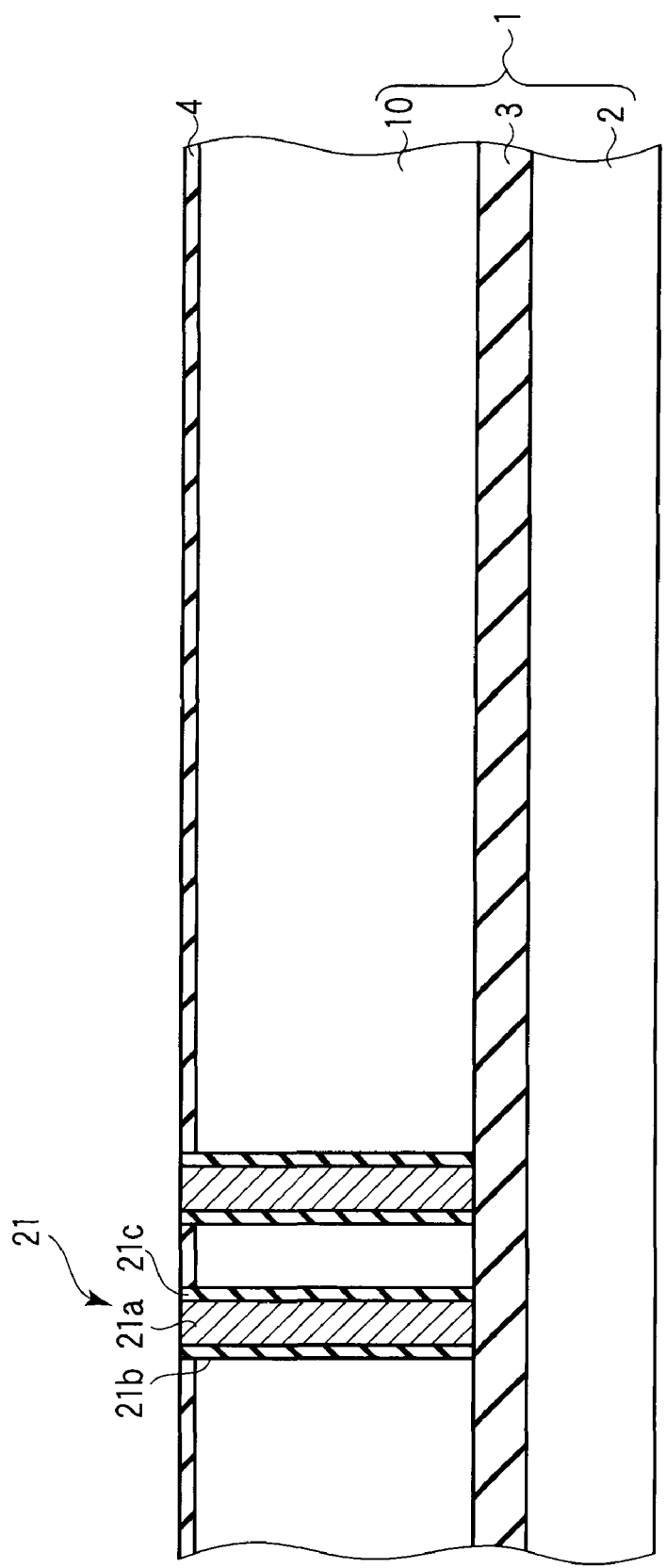
FIG. 5 is a process cross-sectional view shown to explain the method of manufacturing the CMOS image sensor according to the first embodiment.

Then, as shown in, for example, FIG. 5, the Si epitaxial layer 10 is oxidized to form an insulating film 21c constituted of an $SiO_2$ film on the inner wall of each of the contact holes 21b. At this time, the insulating film 21c is controlled in such a manner that the minimum film thickness thereof becomes a predetermined value (5 nm when the working voltage VDD of the sensor is 3.3 V), and is formed to be provided with a substantially uniform film thickness. Further, low resistance polysilicon is embedded in each of the contact holes 21b through each of the insulating films 21c to thereby form contact layers 21a. As a result of this, back side drawn electrodes 21 doubling as alignment marks are minutely formed.

Figure 6:
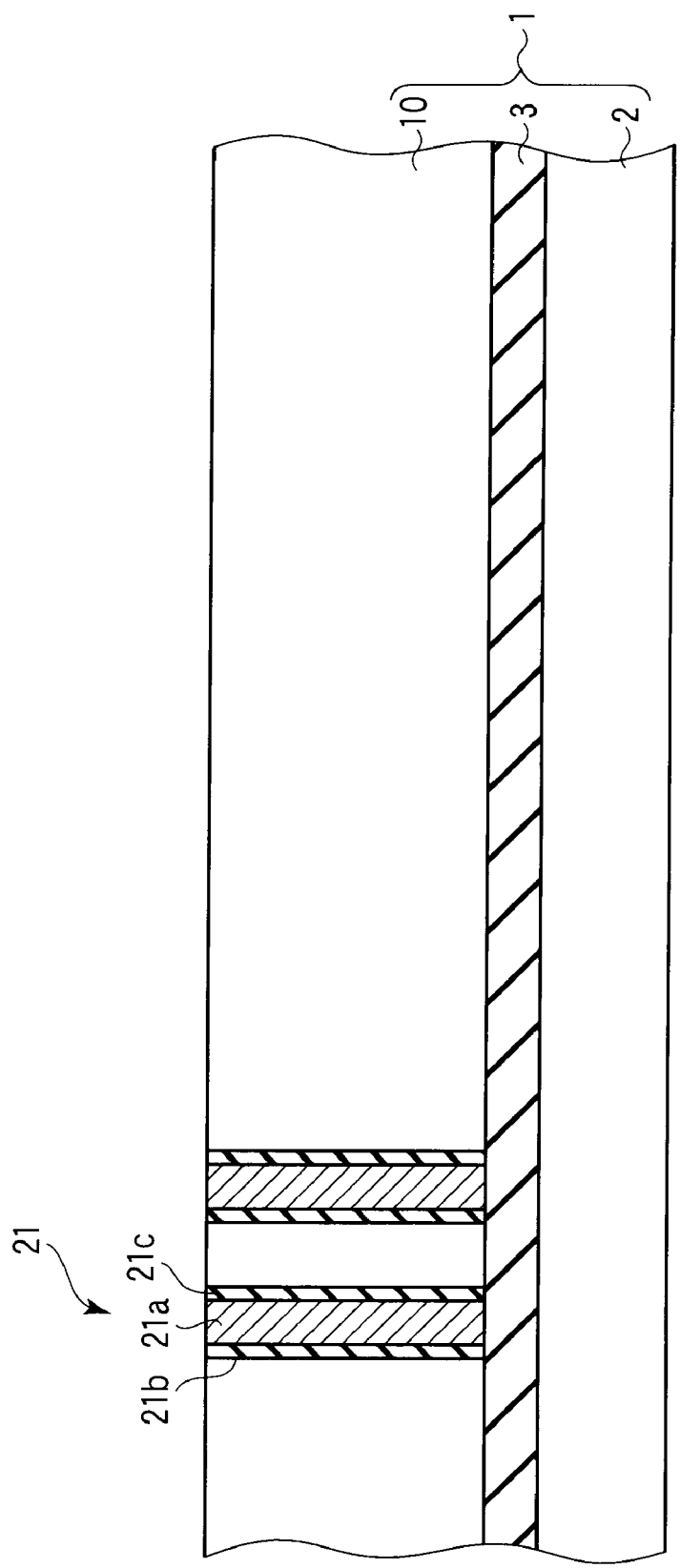
FIG. 6 is a process cross-sectional view shown to explain the method of manufacturing the CMOS image sensor according to the first embodiment.

Then, as shown in, for example, FIG. 6, the stopper film 4 is exfoliated, and thereafter an oxidation process is carried out.

Figure 7:
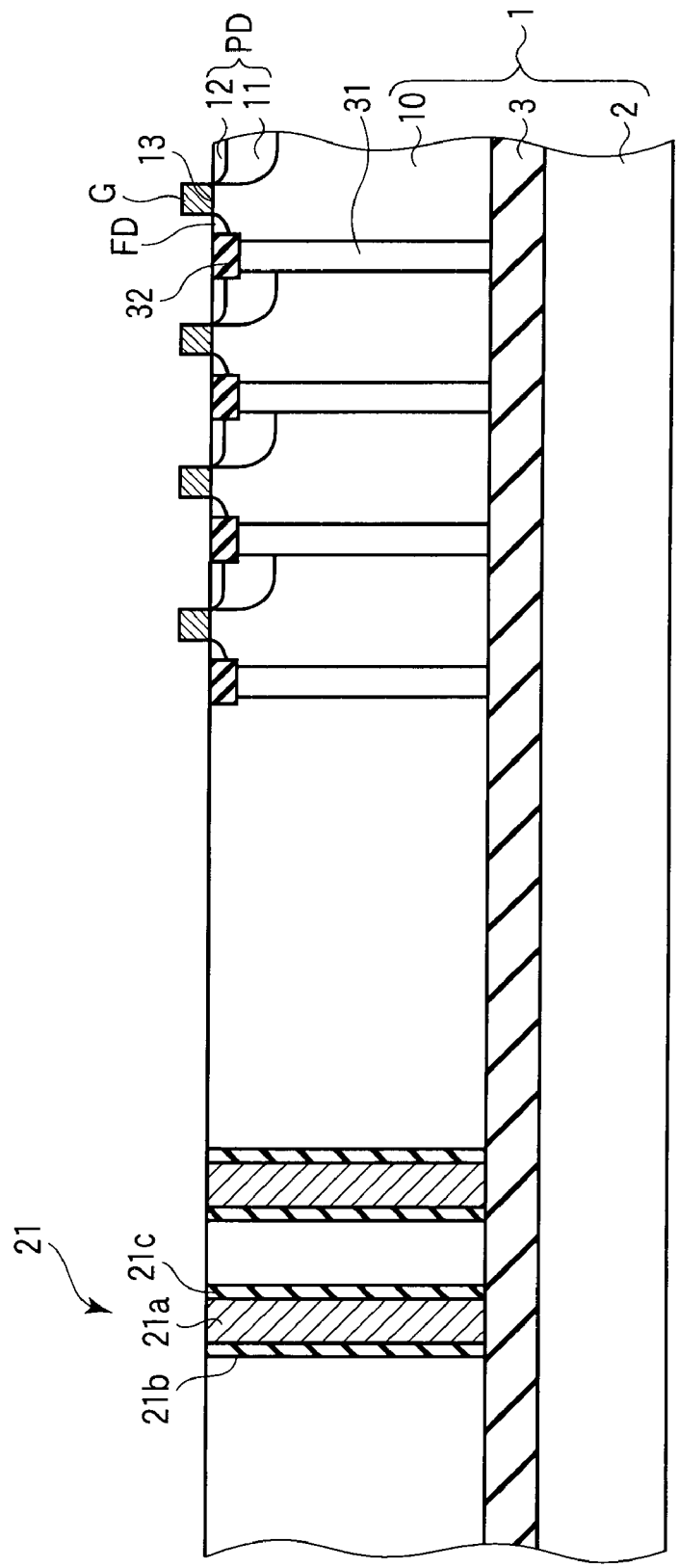
FIG. 7 is a process cross-sectional view shown to explain the method of manufacturing the CMOS image sensor according to the first embodiment.

Then, as shown in, for example, FIG. 7, an ordinary process of manufacturing a metal oxide semiconductor field effect transistor (MOSFET) is carried out to form a pixel separation region 31, pixel separation STI 32, readout gate electrode G of the transfer MOS transistor TG, photodiode section PD (a light receiving section 11, and accumulation layer 12), floating diffusion FD, and the like in the Si epitaxial layer 10 corresponding to the sensor pixel region. In this way, a plurality of unit cells arranged in a matrix form are formed.

Figure 8:
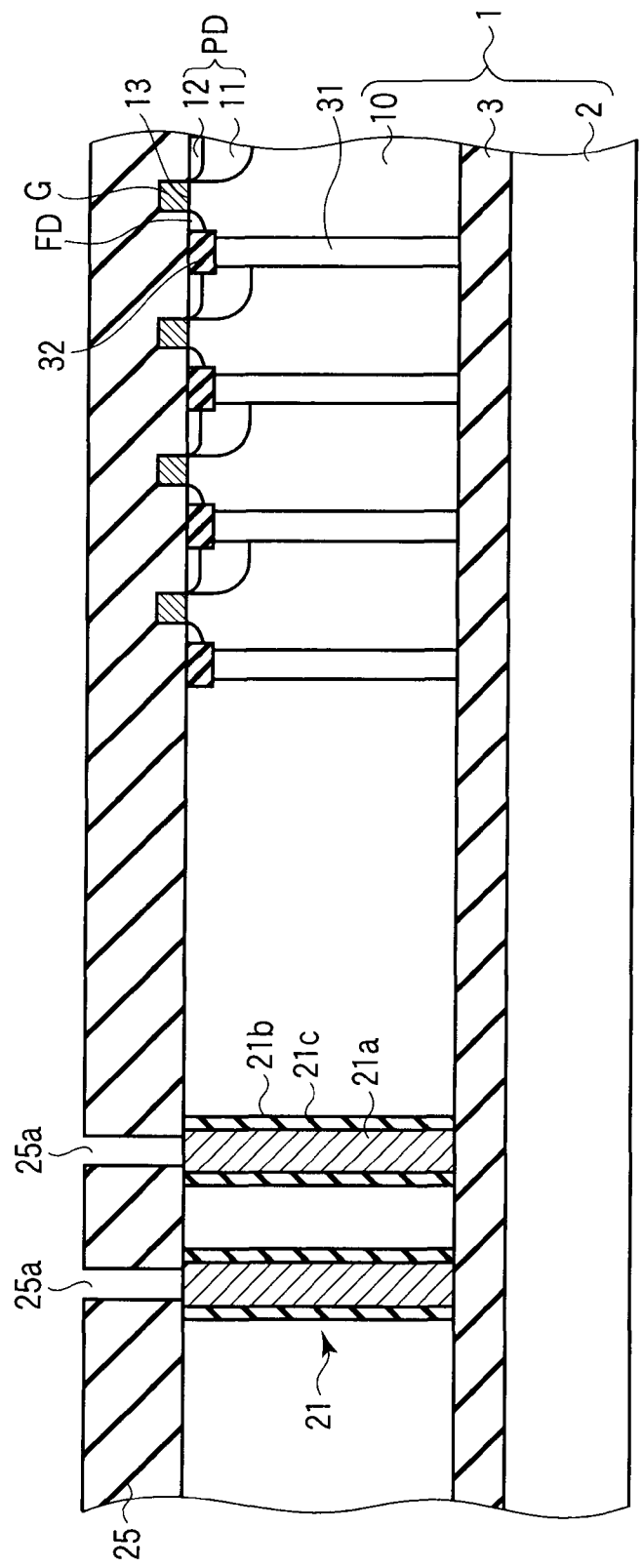
FIG. 8 is a process cross-sectional view shown to explain the method of manufacturing the CMOS image sensor according to the first embodiment.

Then, as shown in, for example FIG. 8, an interlayer insulating film 25 is deposited on the surface of the Si epitaxial layer 10, and contact holes 25a reaching the contact layers 21a are formed in the film 25.

Figure 9:
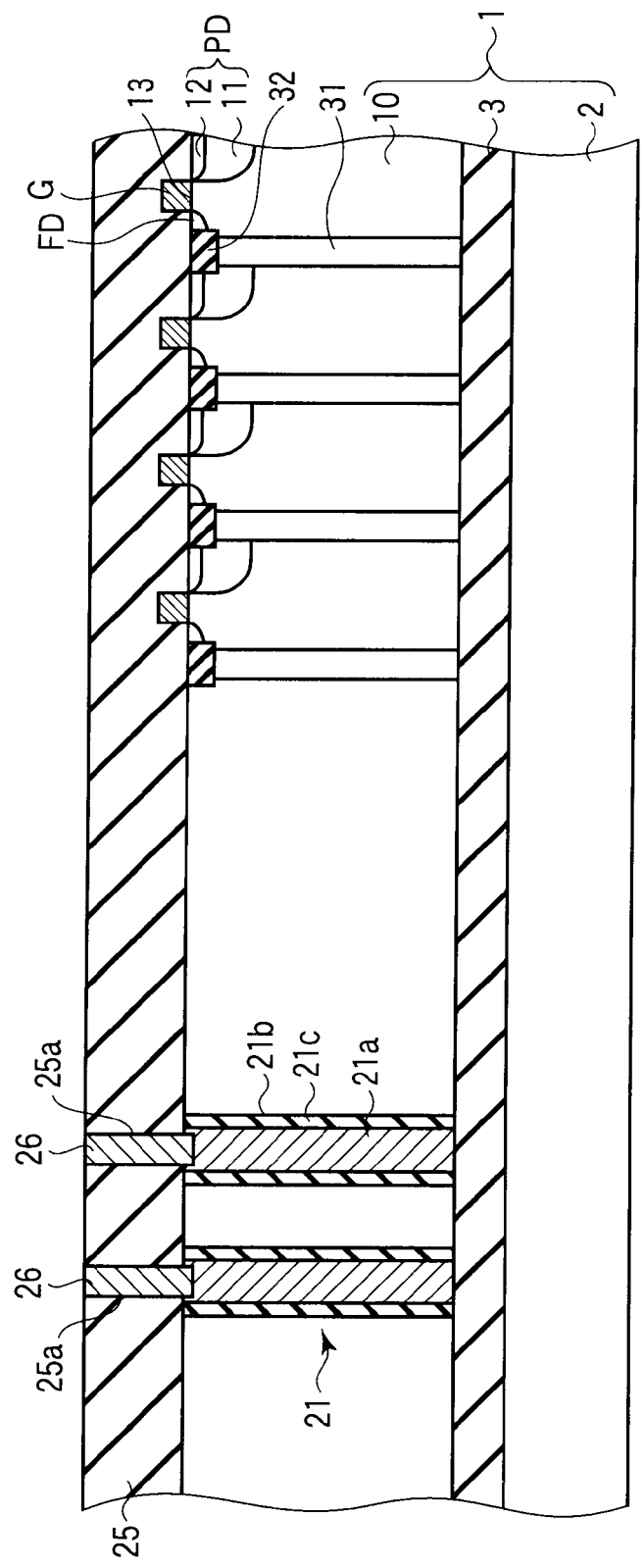
FIG. 9 is a process cross-sectional view shown to explain the method of manufacturing the CMOS image sensor according to the first embodiment.

Then, as shown in, for example, FIG. 9, tungsten (W) is embedded in each of the contact holes 25a, and a chemical mechanical polishing (CMP) process is carried out to form wiring layer contacts 26 connected to the contact layers 21a.

Figure 10:
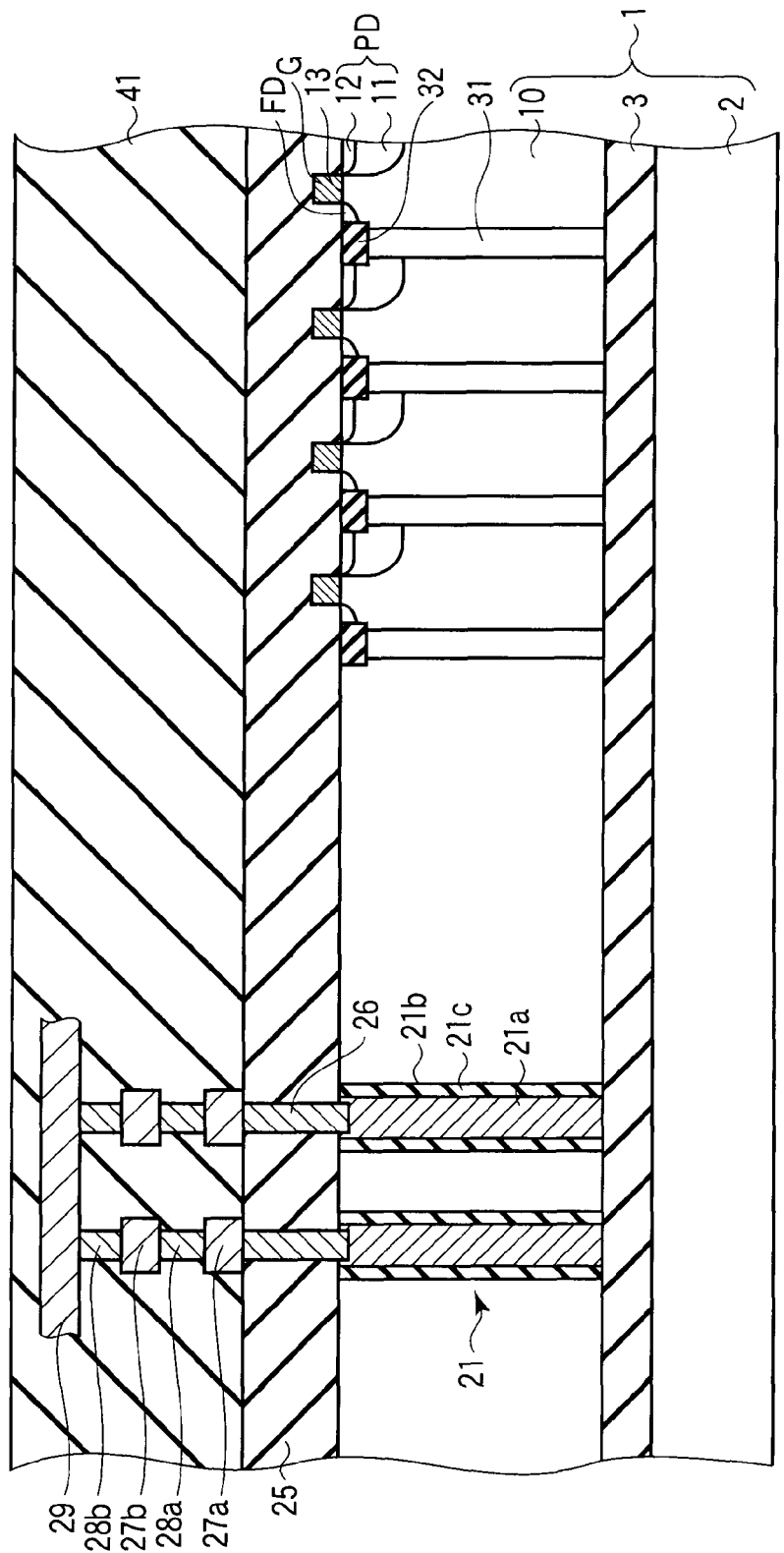
FIG. 10 is a process cross-sectional view shown to explain the method of manufacturing the CMOS image sensor according to the first embodiment.

Then, as shown in, for example, FIG. 10, a known technique is used to form first layer wiring 27a, a first layer via 28a, second layer wiring 27b, second layer via 28b, and wiring layer 29 connected to the insulating film layer 41, and wiring layer contact 26.

Figure 11:
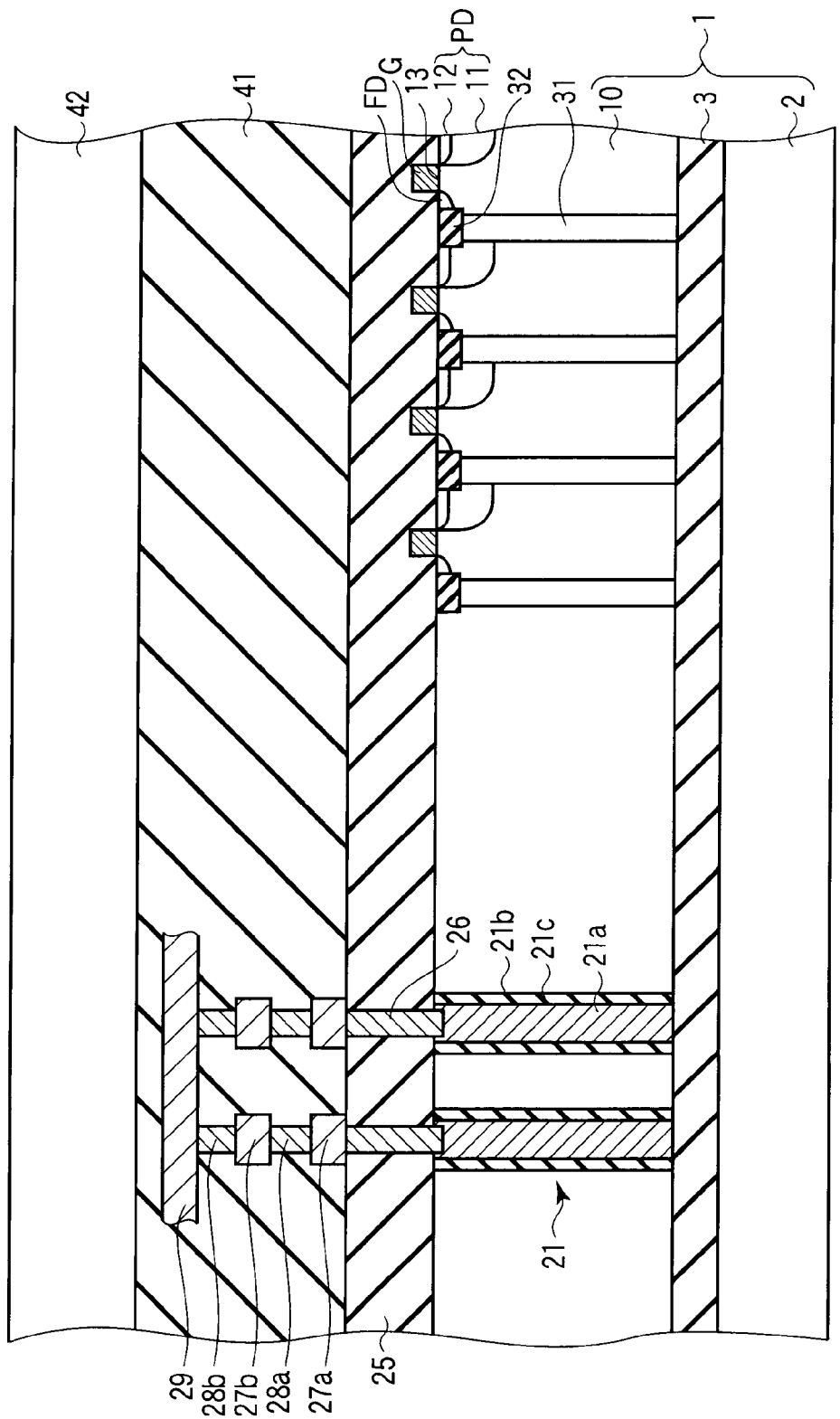
FIG. 11 is a process cross-sectional view shown to explain the method of manufacturing the CMOS image sensor according to the first embodiment.

Then, as shown in, for example, FIG. 11, a support substrate 42 is joined to the surface of the planarized insulating film layer 41 in accordance with a known process.

Figure 12:
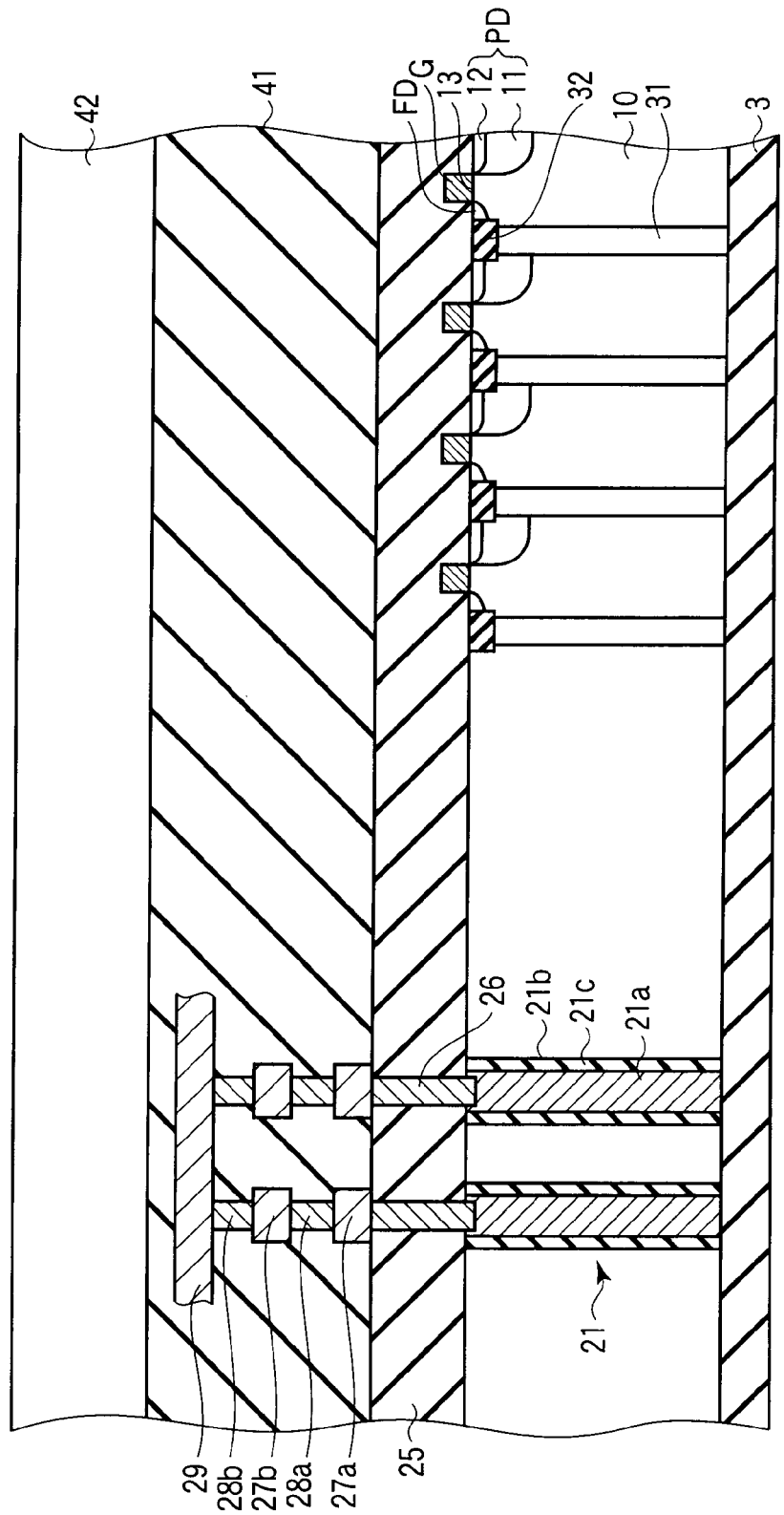
FIG. 12 is a process cross-sectional view shown to explain the method of manufacturing the CMOS image sensor according to the first embodiment.

Then, as shown in, for example, FIG. 12, the Si substrate 2 is removed by etching.

Figure 13:
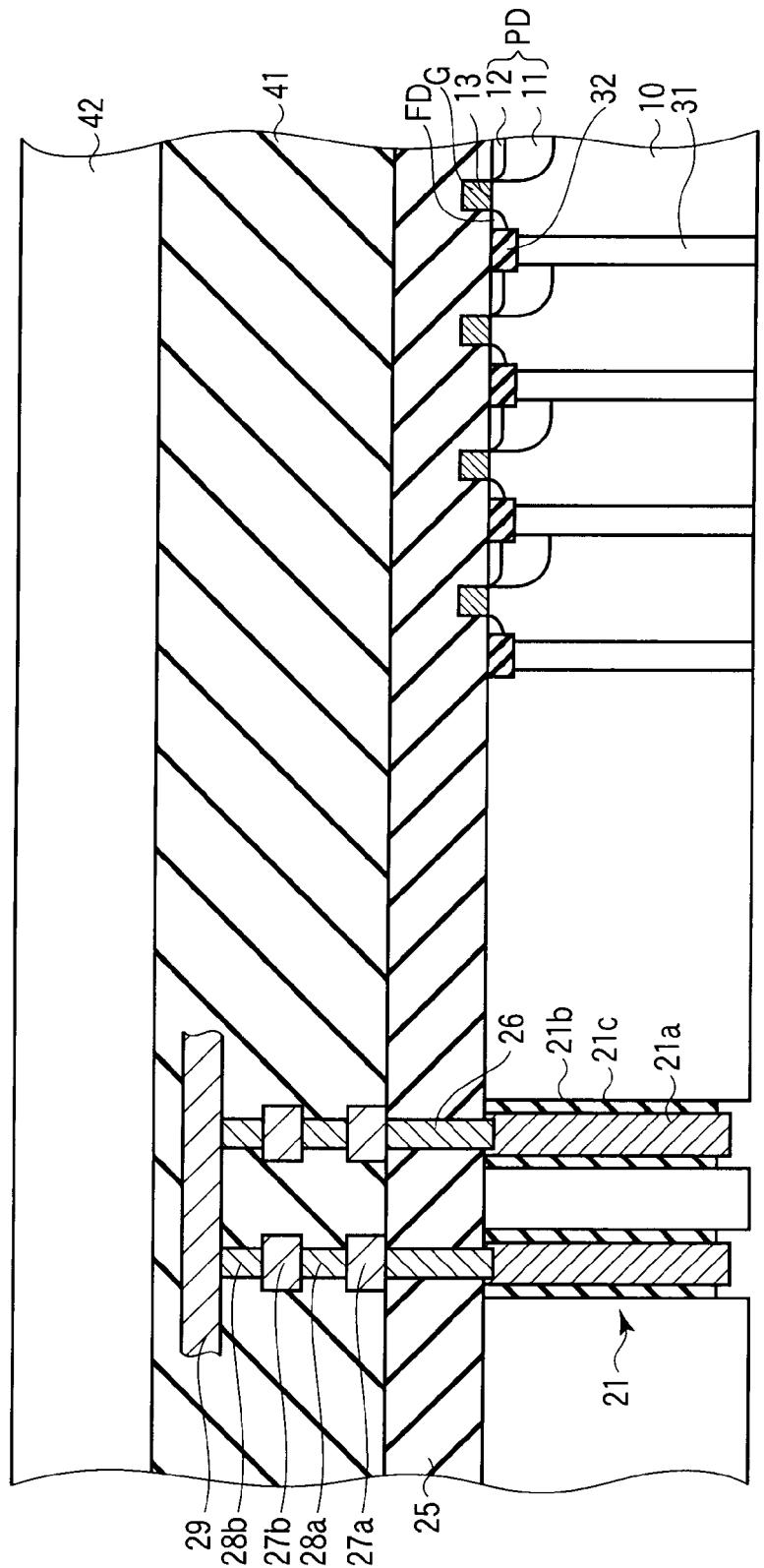
FIG. 13 is a process cross-sectional view shown to explain the method of manufacturing the CMOS image sensor according to the first embodiment.

Then, as shown in, for example, FIG. 13, the embedded oxide film 3 is removed by etching, thereafter part of each of the contact layers 21a is further removed by etching, and part of each of the insulating films 21c is removed by etching in such a manner that one end of each of the contact layers 21a is protruded from each of the insulating films 21c.

Figure 14:
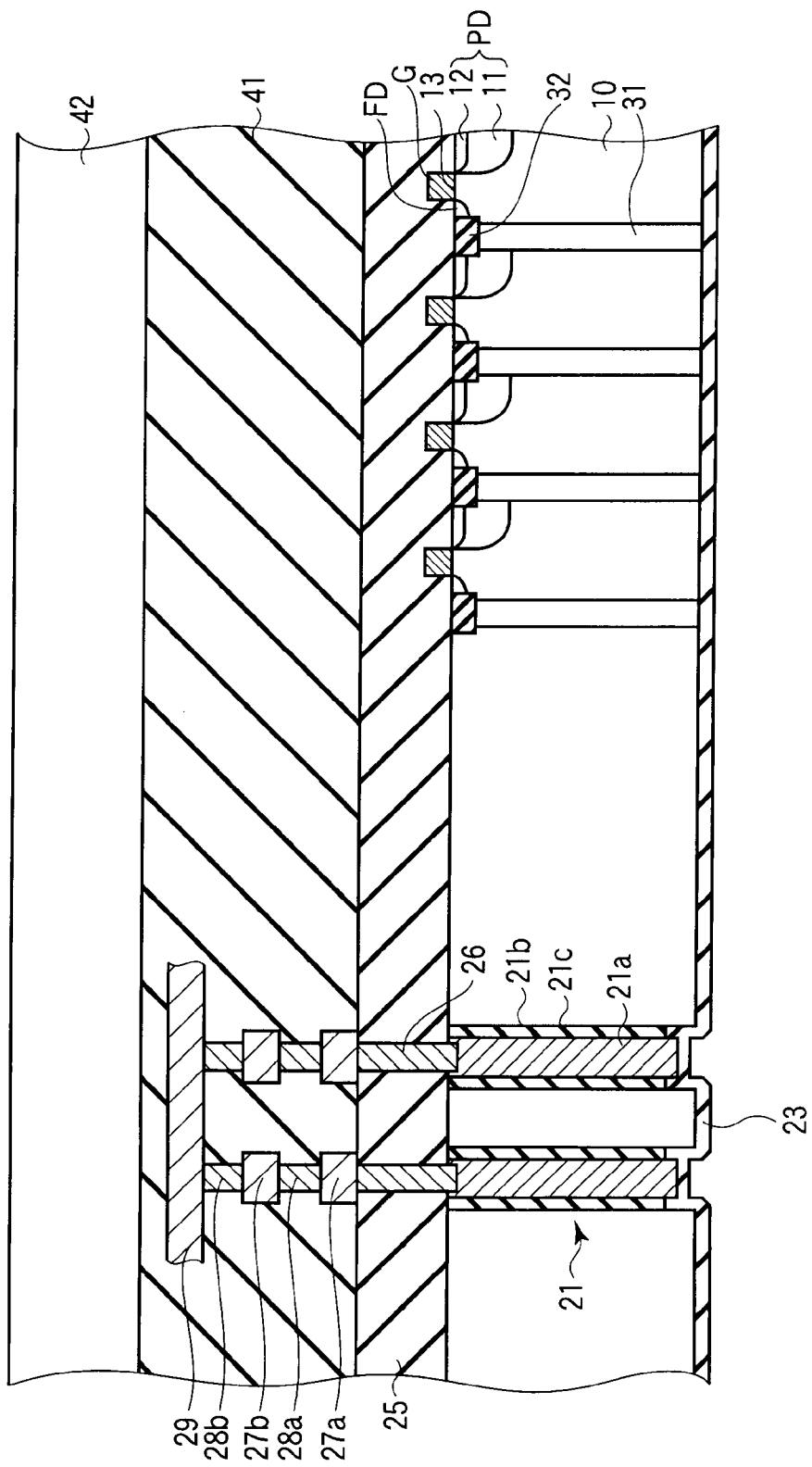
FIG. 14 is a process cross-sectional view shown to explain the method of manufacturing the CMOS image sensor according to the first embodiment.

Then, as shown in, for example, FIG. 14, a back side insulating film 23 is deposited on the back side of the Si epitaxial layer 10.

Figure 15:
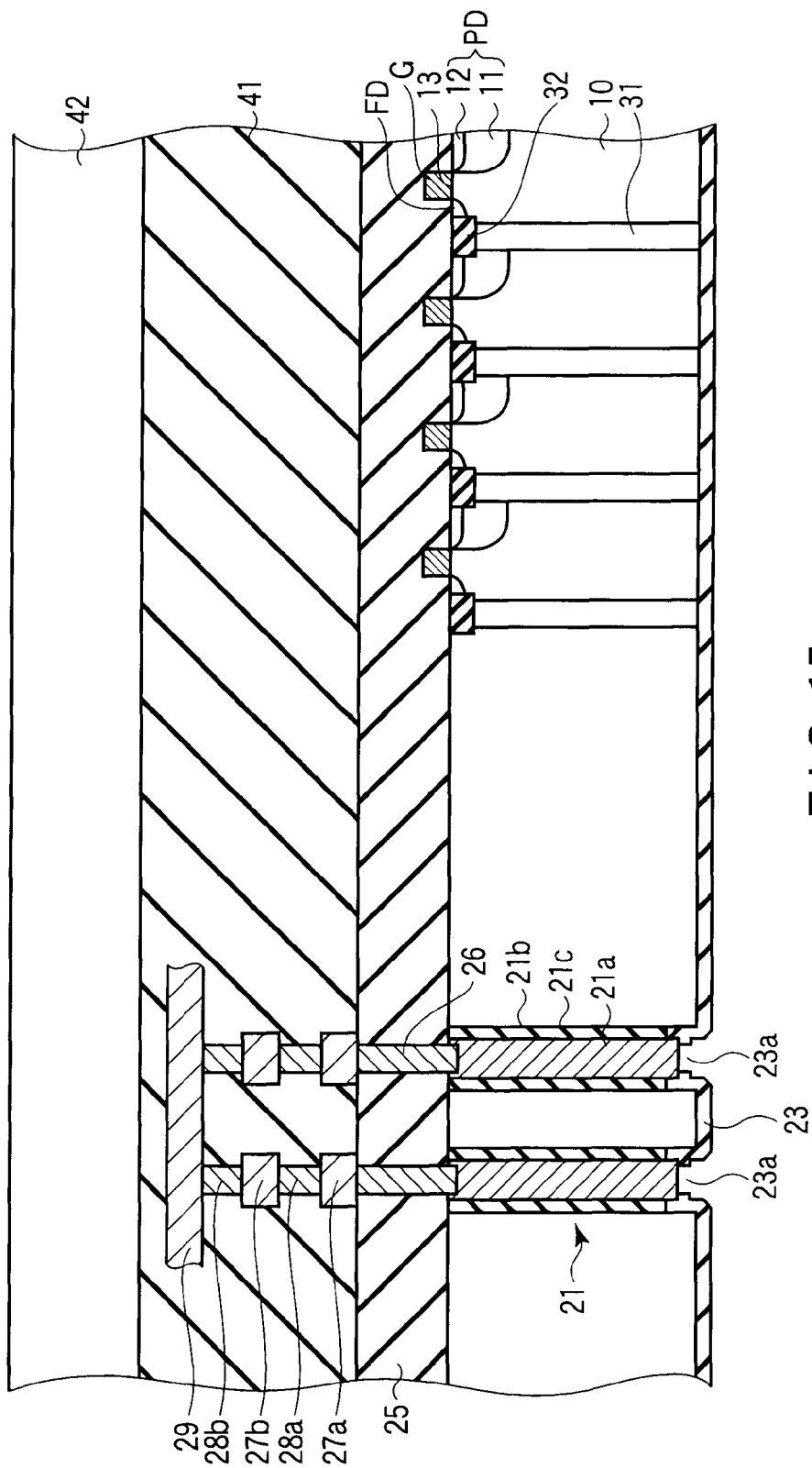
FIG. 15 is a process cross-sectional view shown to explain the method of manufacturing the CMOS image sensor according to the first embodiment.

Then, as shown in, for example, FIG. 15, part of the back side insulating film 23 is removed in such a manner that the contact layers 21a are exposed, thereby forming back side contact sections 23a.

Figure 16:
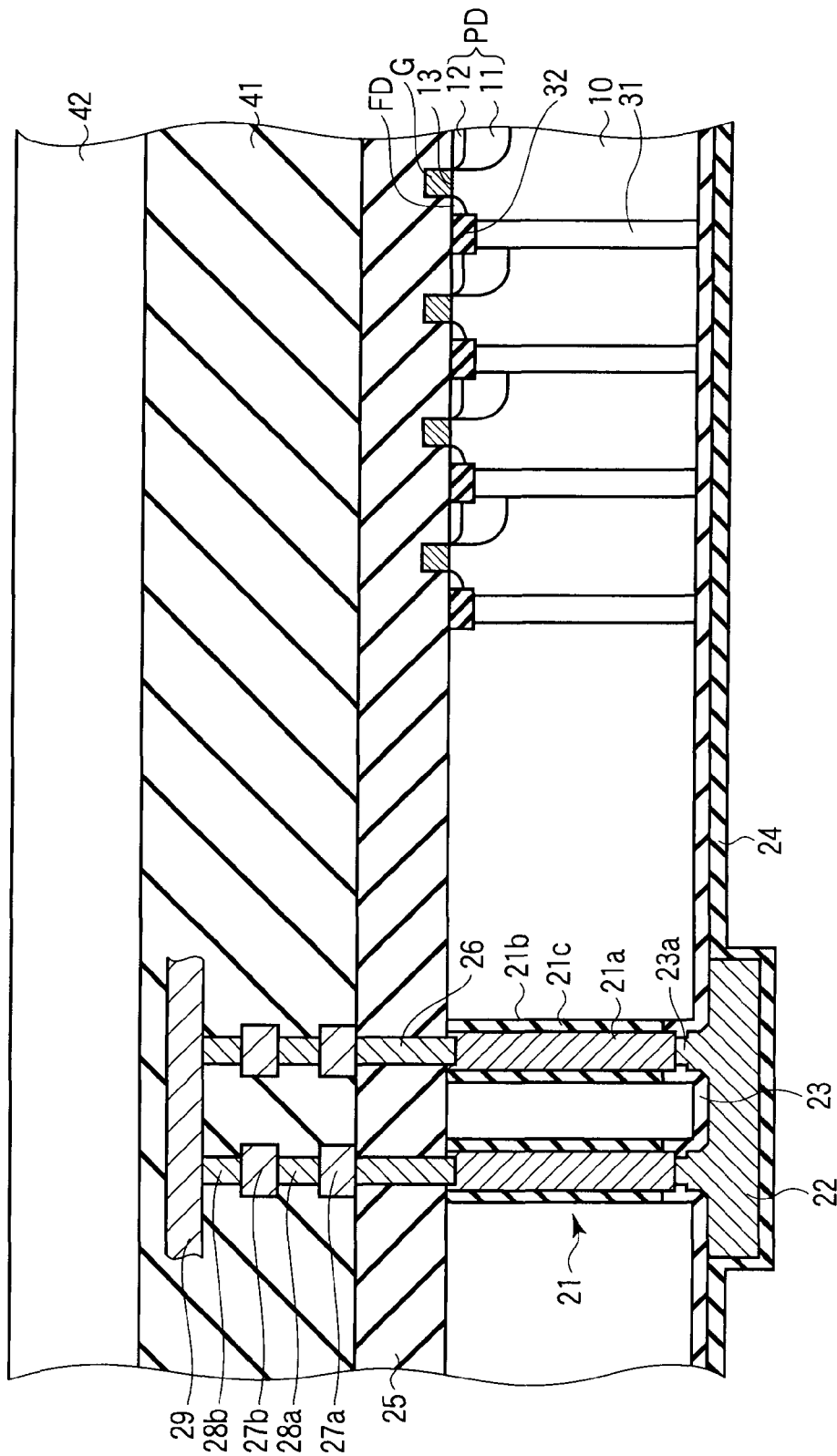
FIG. 16 is a process cross-sectional view shown to explain the method of manufacturing the CMOS image sensor according to the first embodiment.

Then, as shown in, for example, FIG. 16, an Al pad 22 is formed on the back side of the Si epitaxial layer 10 in such a manner that the Al pad 22 is connected to the contact layers 21a through the back side contact sections 23a, and thereafter a passivation insulating film 24 is further deposited on the Al pad 22 and back side insulating film 23.

Figure 17:
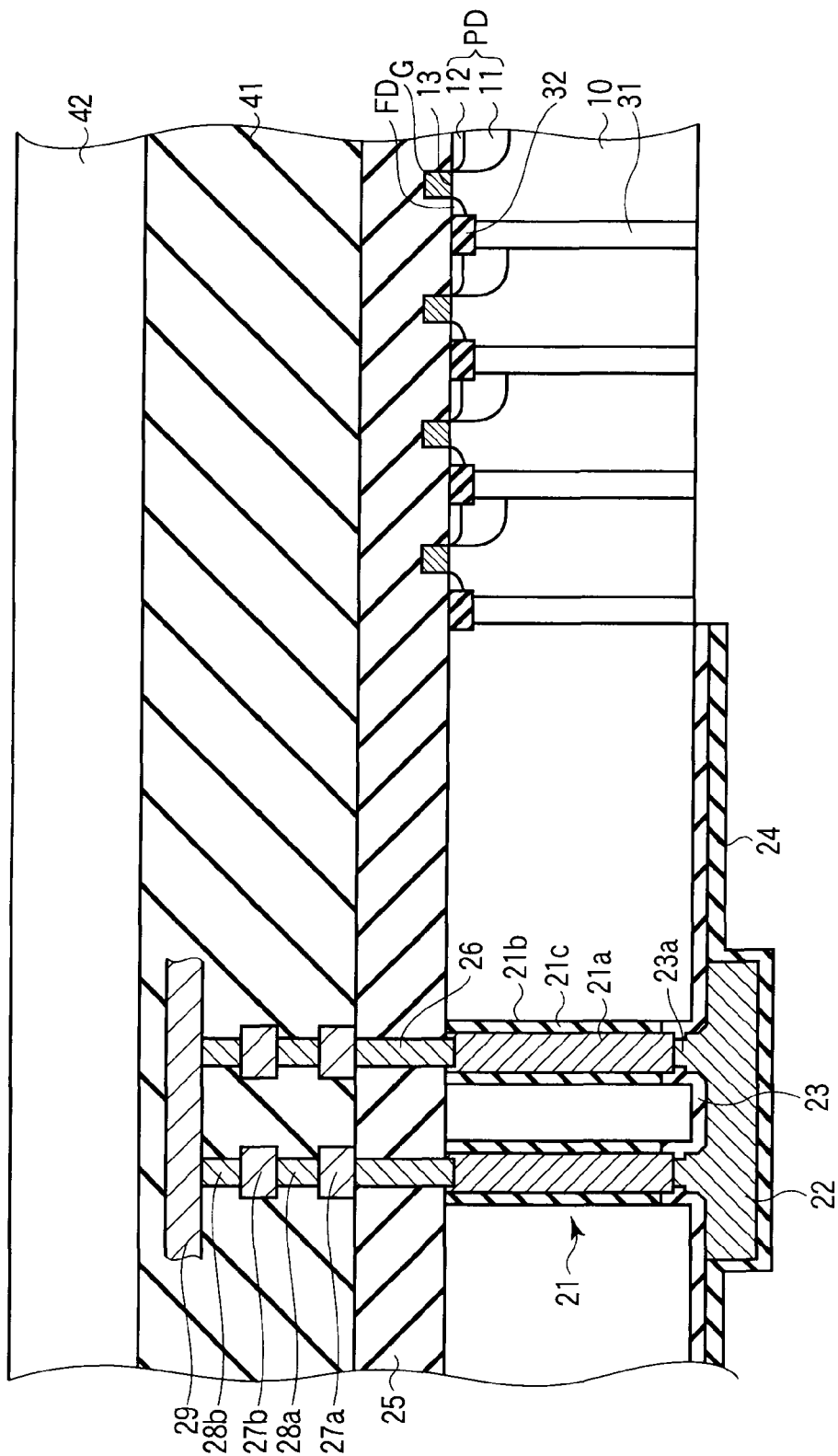
FIG. 17 is a process cross-sectional view shown to explain the method of manufacturing the CMOS image sensor according to the first embodiment.

Then, as shown in, for example, FIG. 17, part of each of the passivation insulating film 24, and back side insulating film 23 corresponding to the sensor pixel region is removed.

Figure 18:
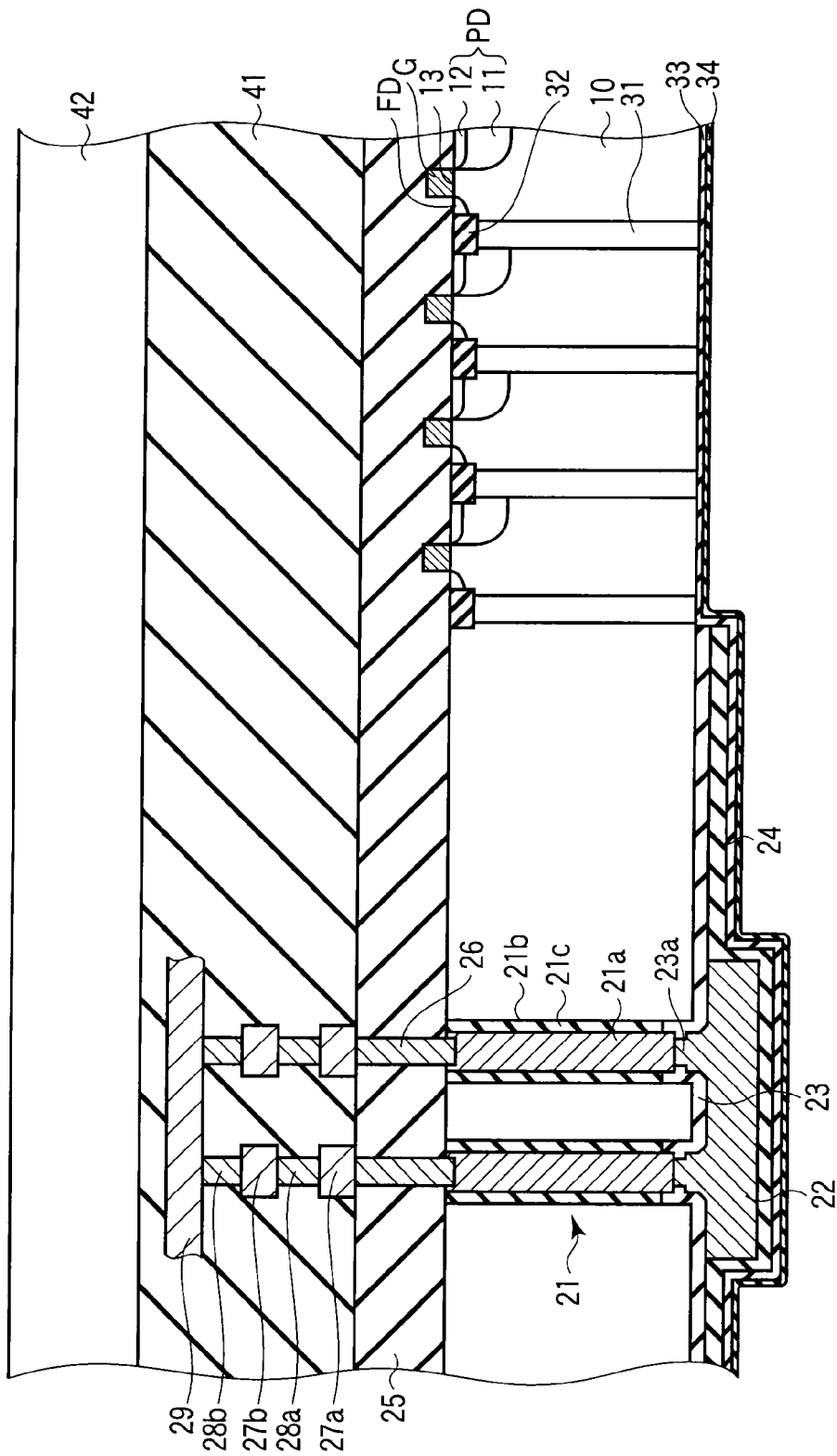
FIG. 18 is a process cross-sectional view shown to explain the method of manufacturing the CMOS image sensor according to the first embodiment.

Then, as shown in, for example, FIG. 18, a passivation oxide film 33 and passivation nitride film 34 are deposited to cover the exposed part of the Si epitaxial layer 10 in the sensor pixel region, and passivation insulating film 24 in the peripheral region.

Figure 19:
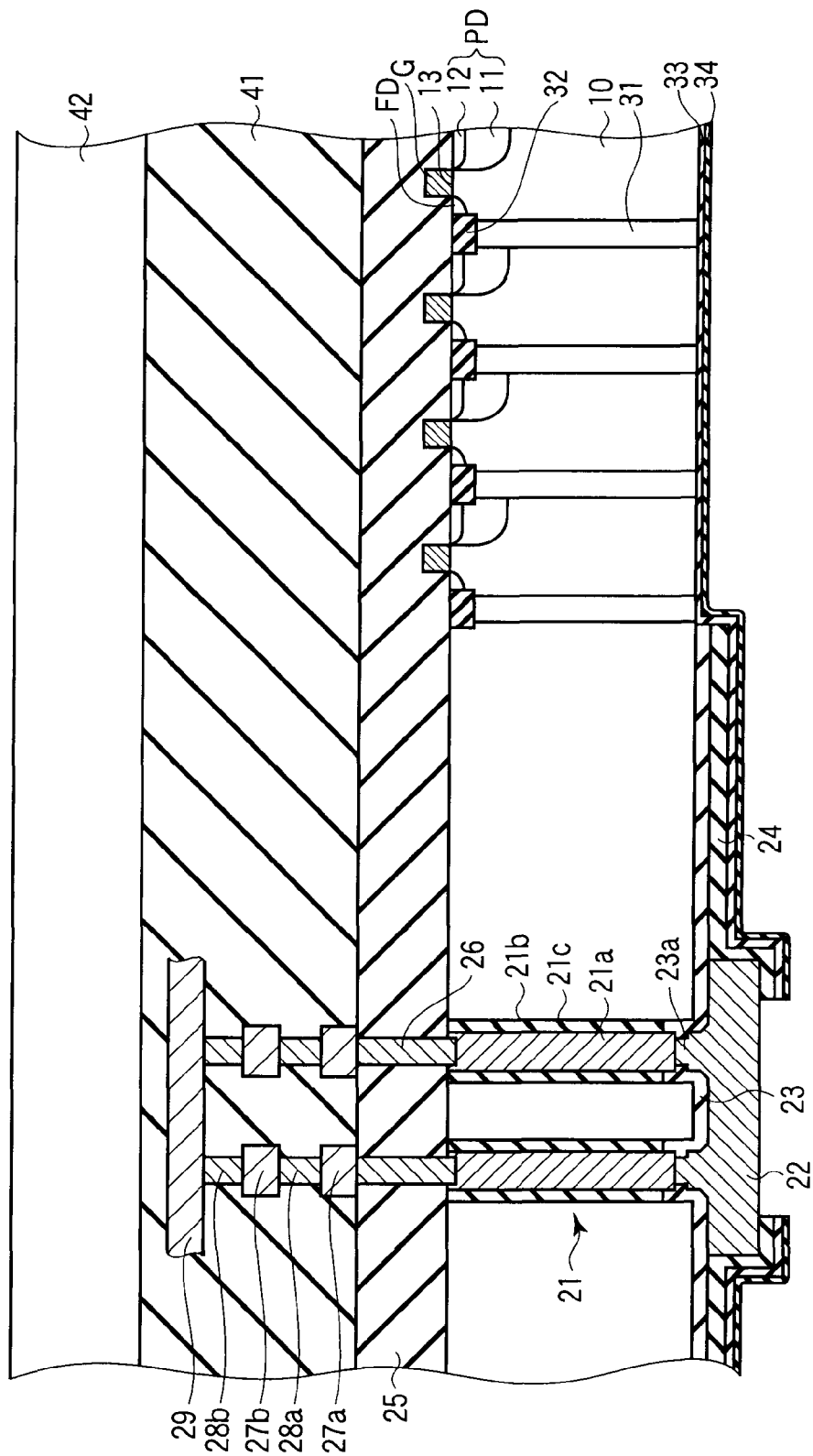
FIG. 19 is a process cross-sectional view shown to explain the method of manufacturing the CMOS image sensor according to the first embodiment.

Then, as shown in, for example, FIG. 19, part of each of the passivation insulating film 24, passivation oxide film 33, and passivation nitride film 34 is opened to expose the Al pad 22 from the opening part.

Finally, a color filter 35, and microlens 36 are formed on the back side of part of the Si epitaxial layer 10 corresponding to the sensor pixel region for each unit cell by utilizing the back side drawn electrode 21 as an alignment mark, whereby a back side illumination CMOS image sensor shown in, for example, FIG. 1 is completed.

As described above, the back side illumination CMOS image sensor is configured so that the alignment mark can also be utilized as it is as an electrode drawn out to the back side of the sensor (or the electrode drawn out to the back side of the sensor can also be utilized as it is as an alignment mark). That is, the back side illumination CMOS image sensor is configured in such a manner that a back side drawn electrode doubling as an alignment mark is formed. As a result of this, it becomes possible to integrate the process of forming the alignment mark, and process of forming the back side drawn electrode into one process. Accordingly, it becomes possible to reduce the number of steps.

Furthermore, according to this embodiment, it becomes possible to miniaturize the alignment mark (to form the alignment mark at a smaller width), and hence it becomes possible to form the back side illumination CMOS image sensor in a smaller size.

Second Embodiment

Figure 20:
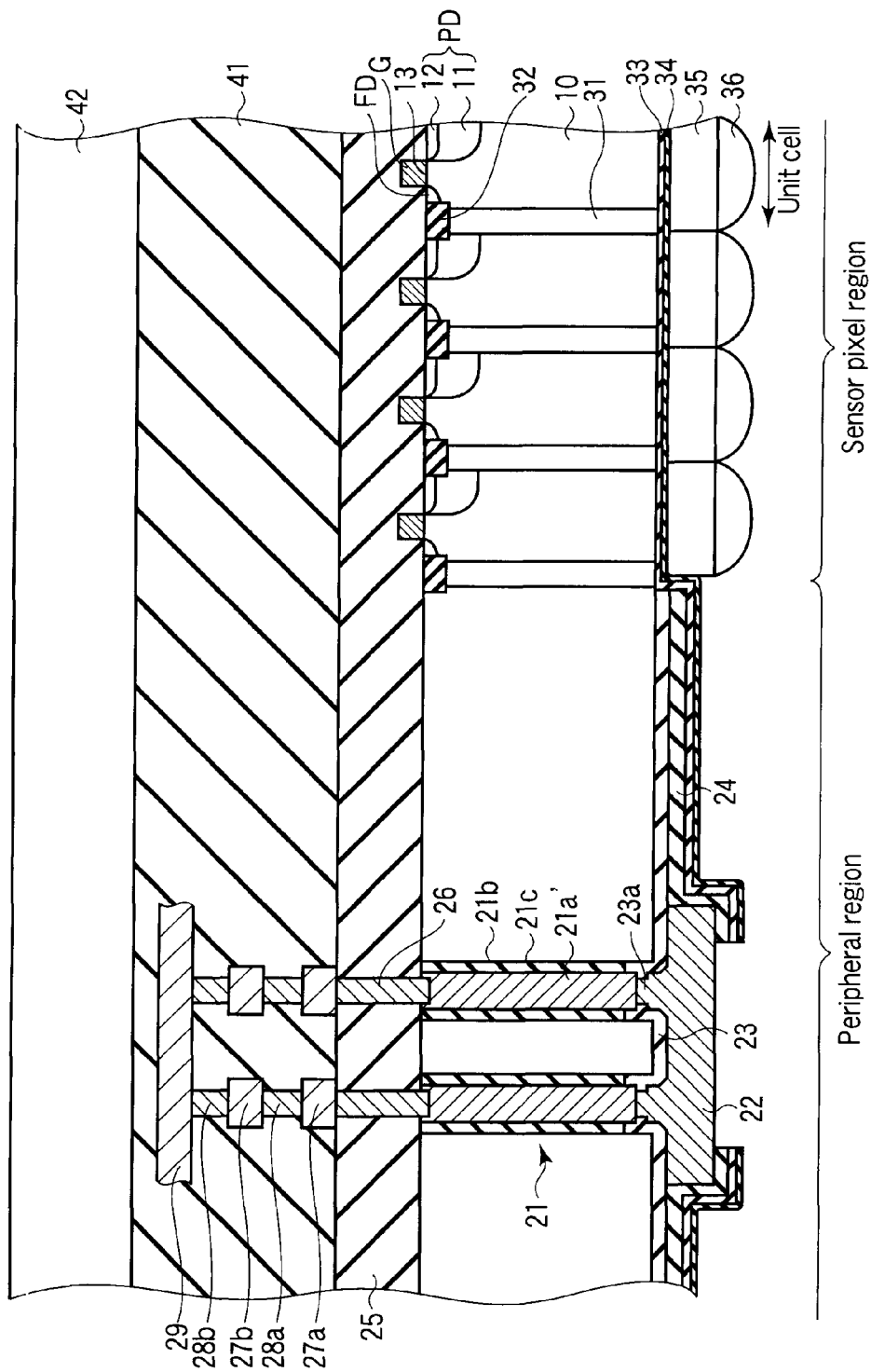
FIG. 20 is a cross-sectional view showing a configuration example of a semiconductor device (back side illumination CMOS image sensor) according to a second embodiment of the present invention.

FIG. 20 shows a configuration example of a semiconductor device according to a second embodiment of the present invention. Here, the case where further the parasitic resistance of a back side drawn electrode is configured to be reduced in a back side illumination CMOS image sensor will be described. It should be noted that the same parts as the first embodiment are denoted by the same reference symbols as the first embodiment, and a detailed description of them will be omitted.

That is, in a back side illumination CMOS image sensor of this embodiment, a back side drawn electrode 21 doubling as an alignment mark is configured by using a contact layer 21a' formed by embedding tungsten. The contact layer 21a' is formed by, for example, replacing the low resistance polysilicon constituting the contact layer 21a described previously with tungsten.

A method of manufacturing the back side illumination CMOS image sensor configured as described above will be described below. It should be noted that the process up to the step of removing the Si substrate 2 by etching is identical with the first embodiment, and hence the steps to be carried out thereafter will be described below.

Figure 21:
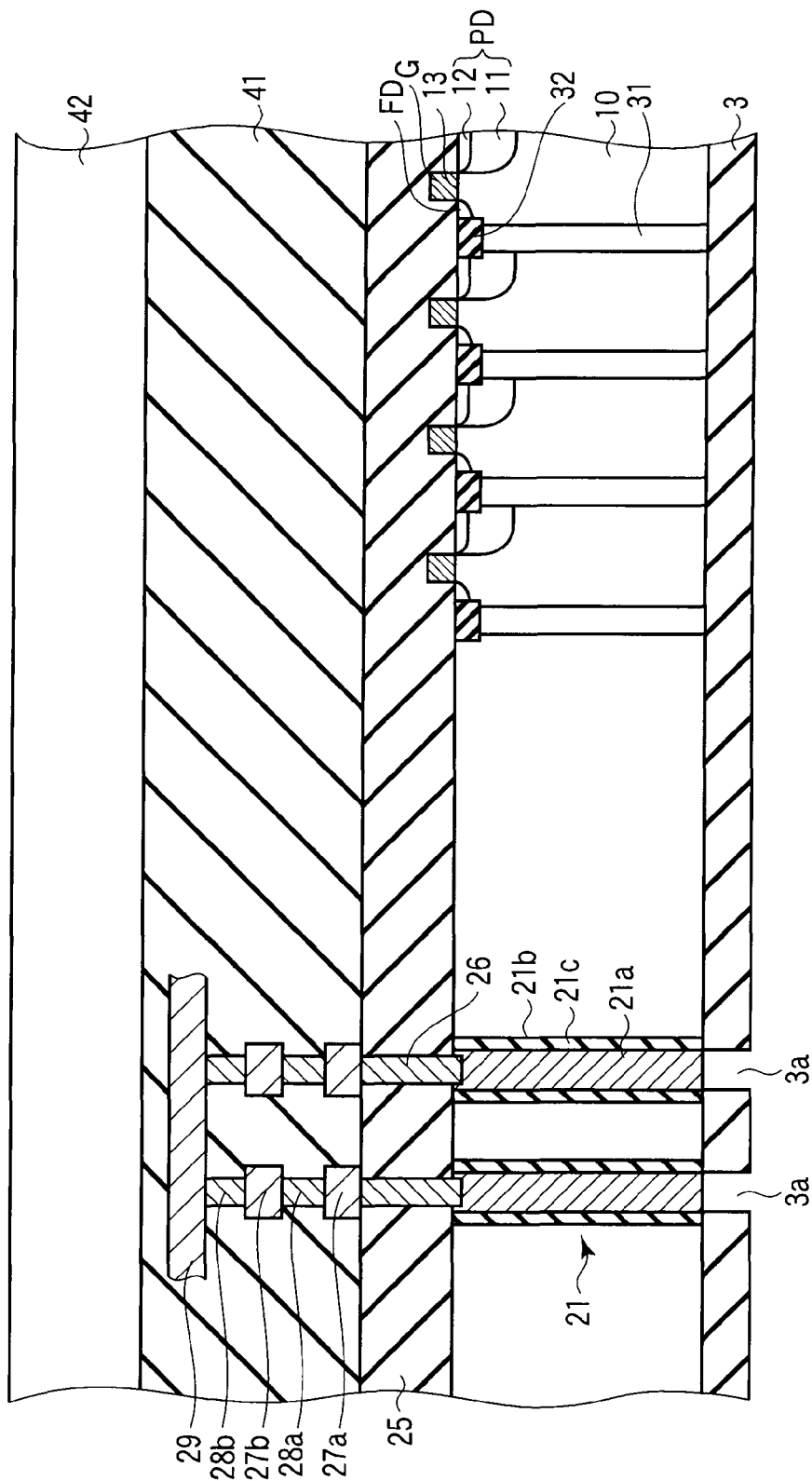
FIG. 21 is a process cross-sectional view shown to explain a method of manufacturing the CMOS image sensor according to the second embodiment.

First, in the state where the process up to the step of removing the Si substrate 2 by etching has been carried out (see FIGS. 3 to 12), as shown in, for example, FIG. 21, a through via hole 3a corresponding to each of the contact layers 21a is formed in an embedded oxide film 3 by a known photolithographic process.

Figure 22:
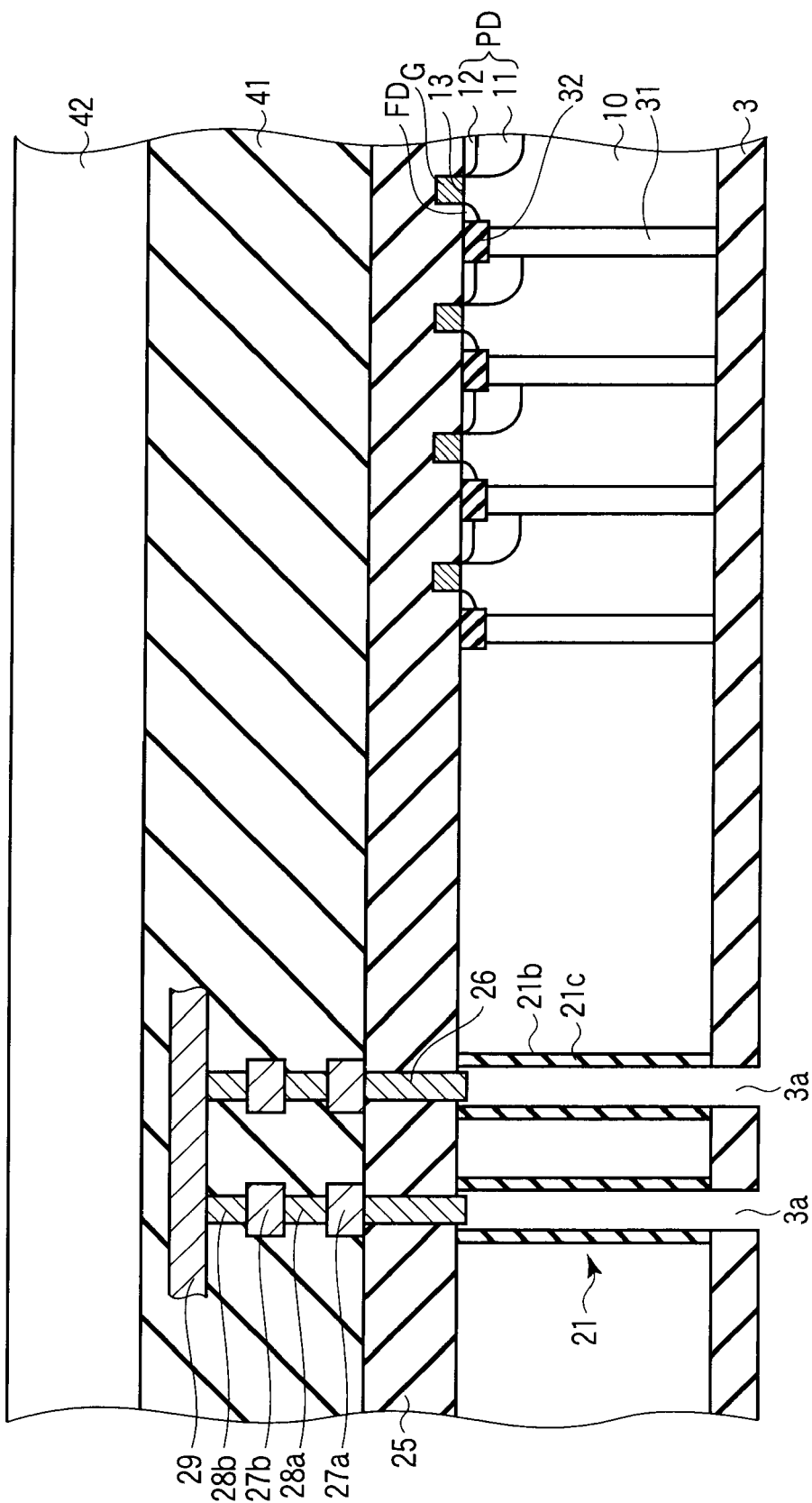
FIG. 22 is a process cross-sectional view shown to explain the method of manufacturing the CMOS image sensor according to the second embodiment.

Then, as shown in, for example, FIG. 22, the low resistance polysilicon of each of the contact layers 21a is removed by etching.

Figure 23:
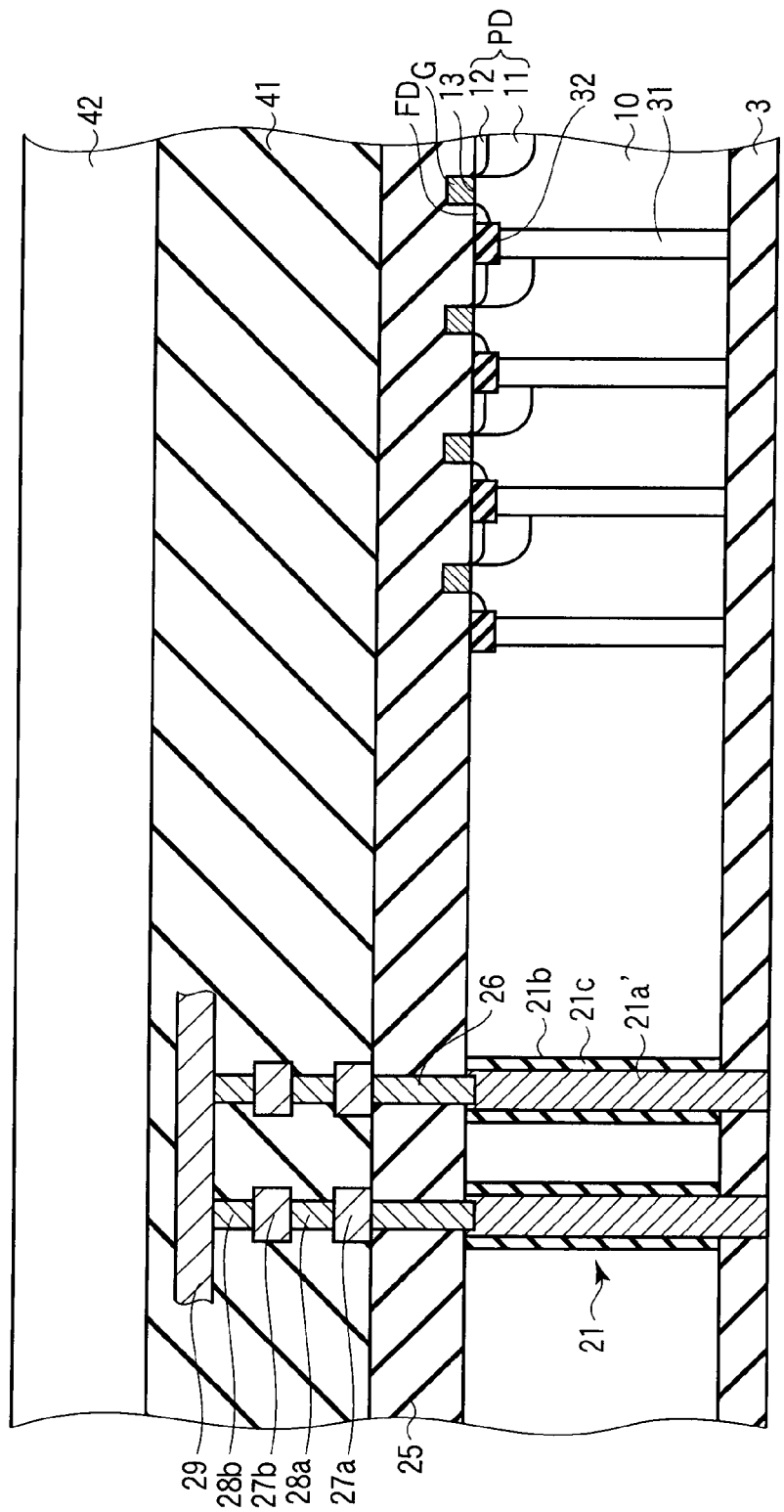
FIG. 23 is a process cross-sectional view shown to explain the method of manufacturing the CMOS image sensor according to the second embodiment.

Then, as shown in, for example, FIG. 23, tungsten is embedded in each of the contact holes 21b through each of the insulating layers 21c to form contact layers 21a'. As a result of this, back side drawn electrodes 21 including the contact layers 21a' formed by embedding tungsten in the contact holes 21b, and doubling as alignment marks are formed minutely. In this case, the parasitic resistance of the contact layer 21a' is smaller than that of the contact layer 21a.

Then, as shown in, for example, FIG. 24, the embedded oxide film 3 is removed by etching, thereafter part of each of the contact layers 21a' is further removed by etching, and part of each of the insulating films 21c is removed in such a manner that one end of each of the contact layers 21a' is protruded from each of the insulating films 21c.

Then, as shown in, for example, FIG. 25, a back side insulating film 23 is deposited on the back side of the Si epitaxial layer 10.

Figure 26:
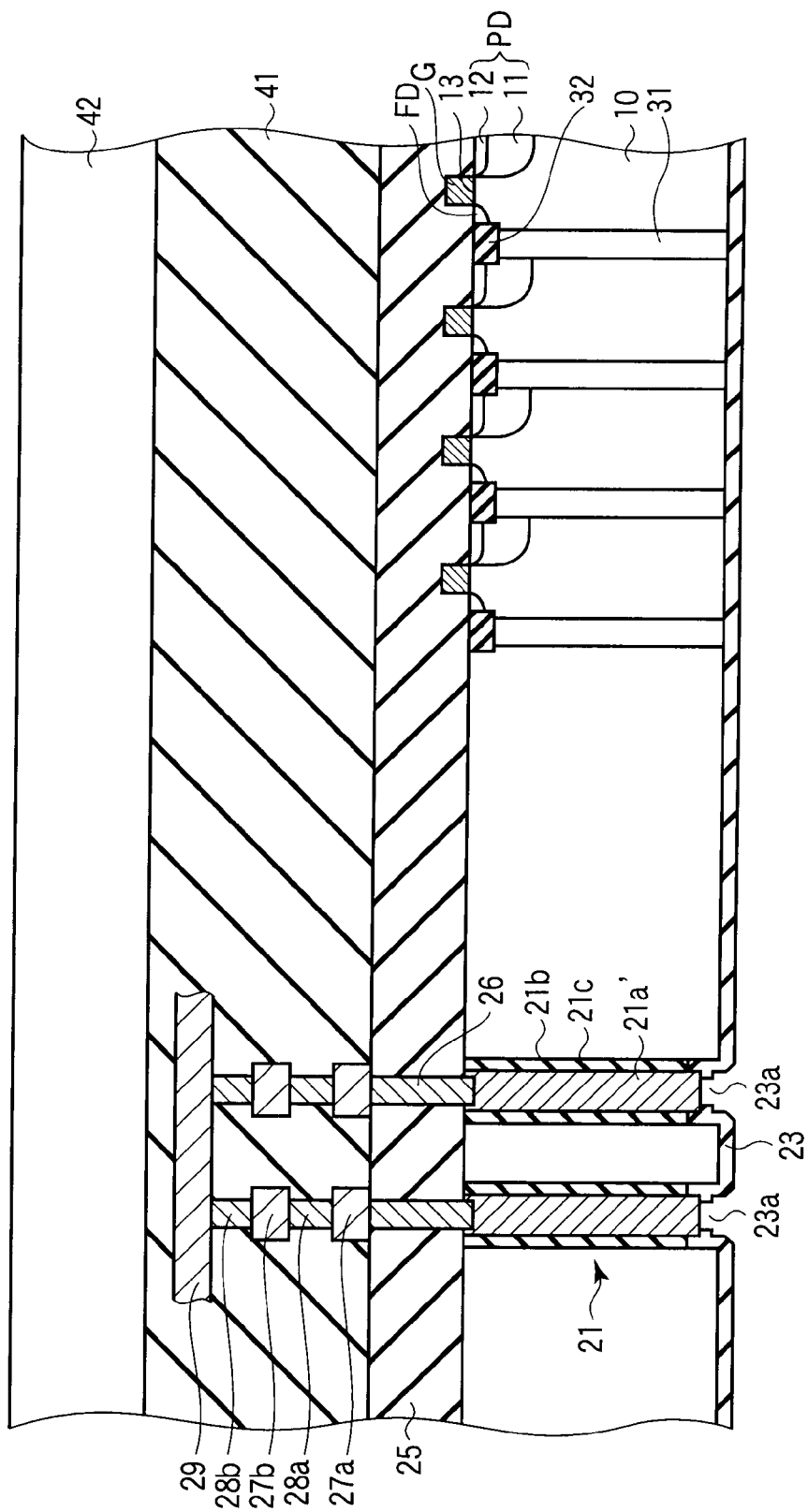
FIG. 26 is a process cross-sectional view shown to explain the method of manufacturing the CMOS image sensor according to the second embodiment.

Then, as shown in, for example, FIG. 26, part of the back side insulating film 23 is removed to expose the contact layers 21a' and form back side contact sections 23a.

Figure 27:
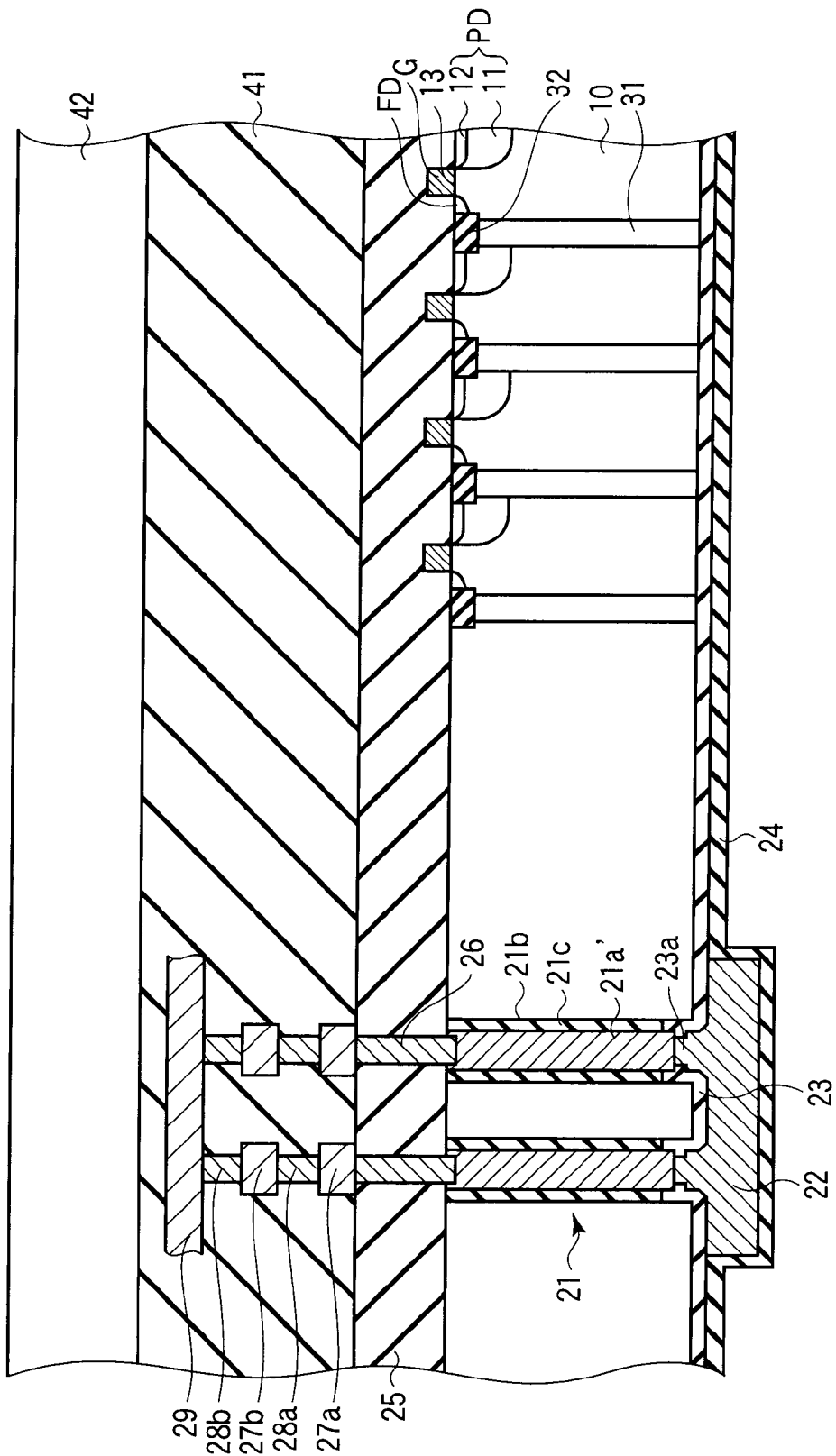
FIG. 27 is a process cross-sectional view shown to explain the method of manufacturing the CMOS image sensor according to the second embodiment.

Then, as shown in, for example, FIG. 27, an Al pad 22 is formed on the back side of the Si epitaxial layer 10 in such a manner that the Al pad 22 is connected to the contact layers 21a' through the back side contact sections 23a, and thereafter a passivation insulating film 24 is further deposited on the Al pad 22 and back side insulating film 23.

Figure 28:
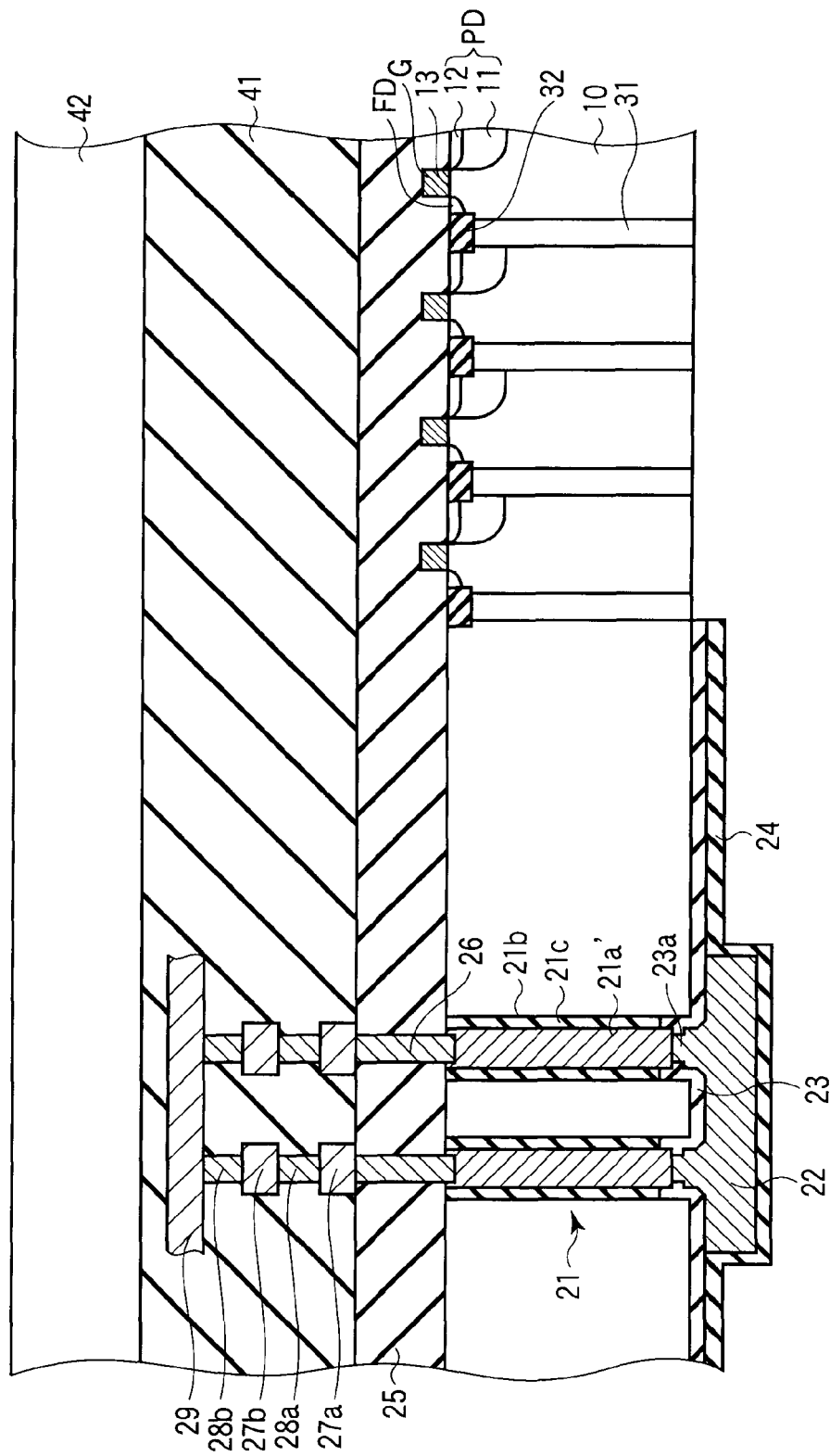
FIG. 28 is a process cross-sectional view shown to explain the method of manufacturing the CMOS image sensor according to the second embodiment.

Then, as shown in, for example, FIG. 28, part of each of the passivation insulating film 24 and back side insulating film 23 corresponding to the sensor pixel region is removed.

Figure 29:
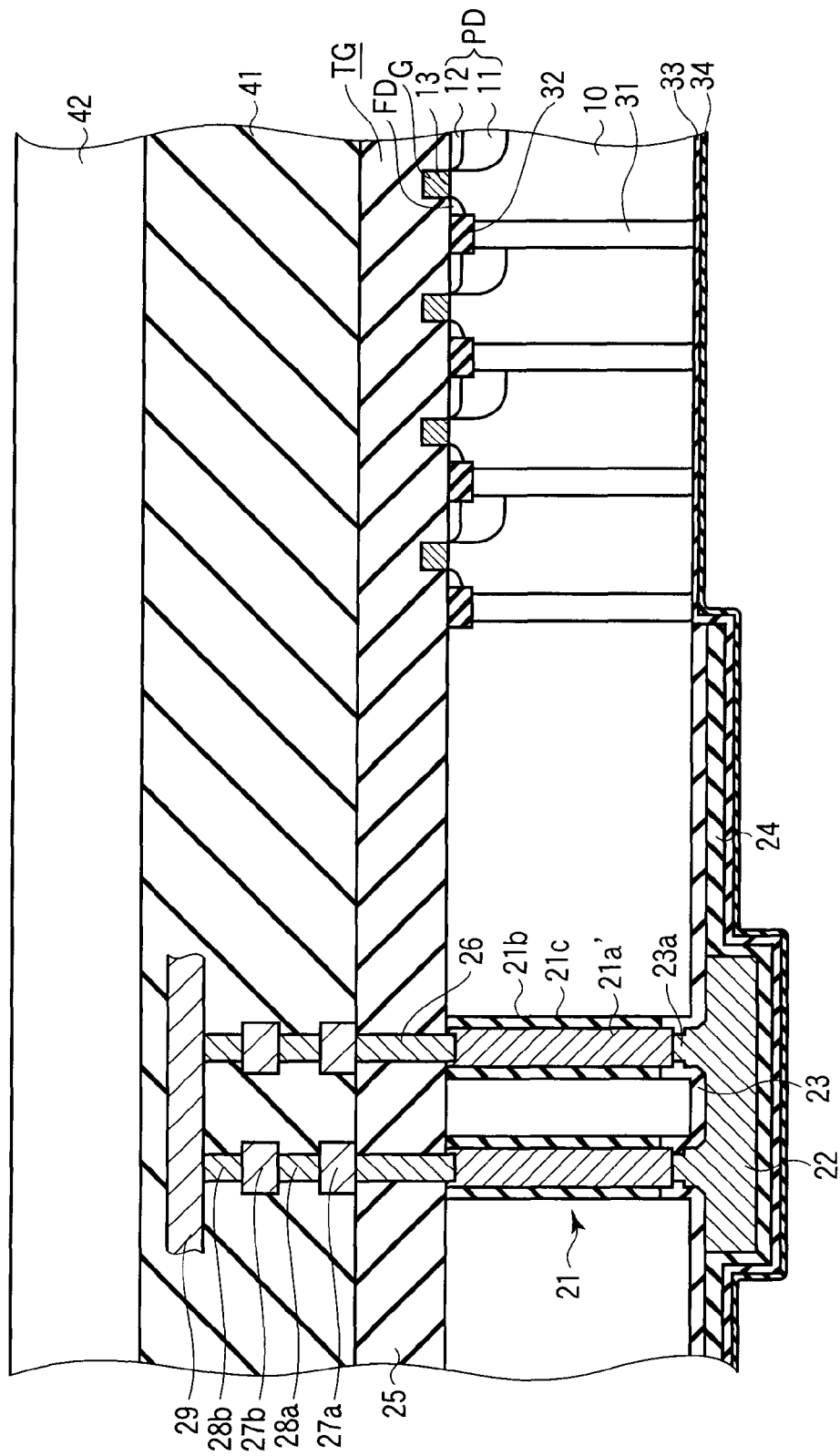
FIG. 29 is a process cross-sectional view shown to explain the method of manufacturing the CMOS image sensor according to the second embodiment.

Then, as shown in, for example, FIG. 29, a passivation oxide film 33 and passivation nitride film 34 are deposited to cover the exposed part of the Si epitaxial layer 10 in the sensor pixel region, and passivation insulating film 24 in the peripheral region.

Figure 30:
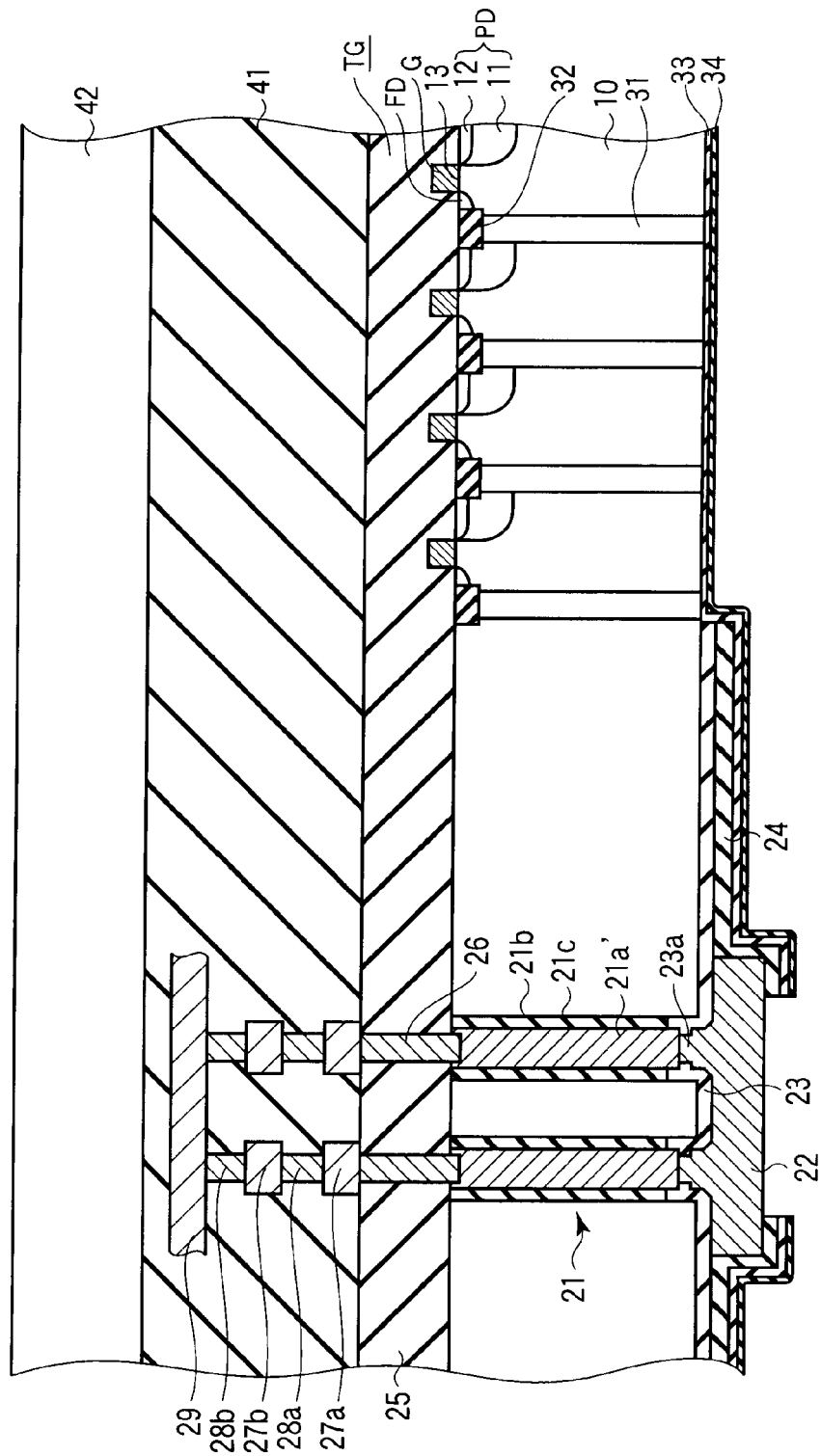
FIG. 30 is a process cross-sectional view shown to explain the method of manufacturing the CMOS image sensor according to the second embodiment.

Then, as shown in, for example, FIG. 30, part of each of the passivation insulating film 24, passivation oxide film 33, and passivation nitride film 34 is opened to expose the Al pad 22 from the opening part.

Finally, a color filter 35, and microlens 36 are formed on the back side of part of the Si epitaxial layer 10 corresponding to the sensor pixel region for each unit cell by utilizing the back side drawn electrode 21 as an alignment mark, whereby a back side illumination CMOS image sensor shown in, for example, FIG. 20 is completed.

In the case of this embodiment, in addition to the advantage (that the alignment mark can be miniaturized, and the back side illumination CMOS image sensor can be formed smaller in size), it is possible to largely reduce the parasitic resistance of the back side drawn electrode 21 by replacing the polysilicon serving as the contact layer of the back side drawn electrode 21 with tungsten.

Third Embodiment

Figure 31:
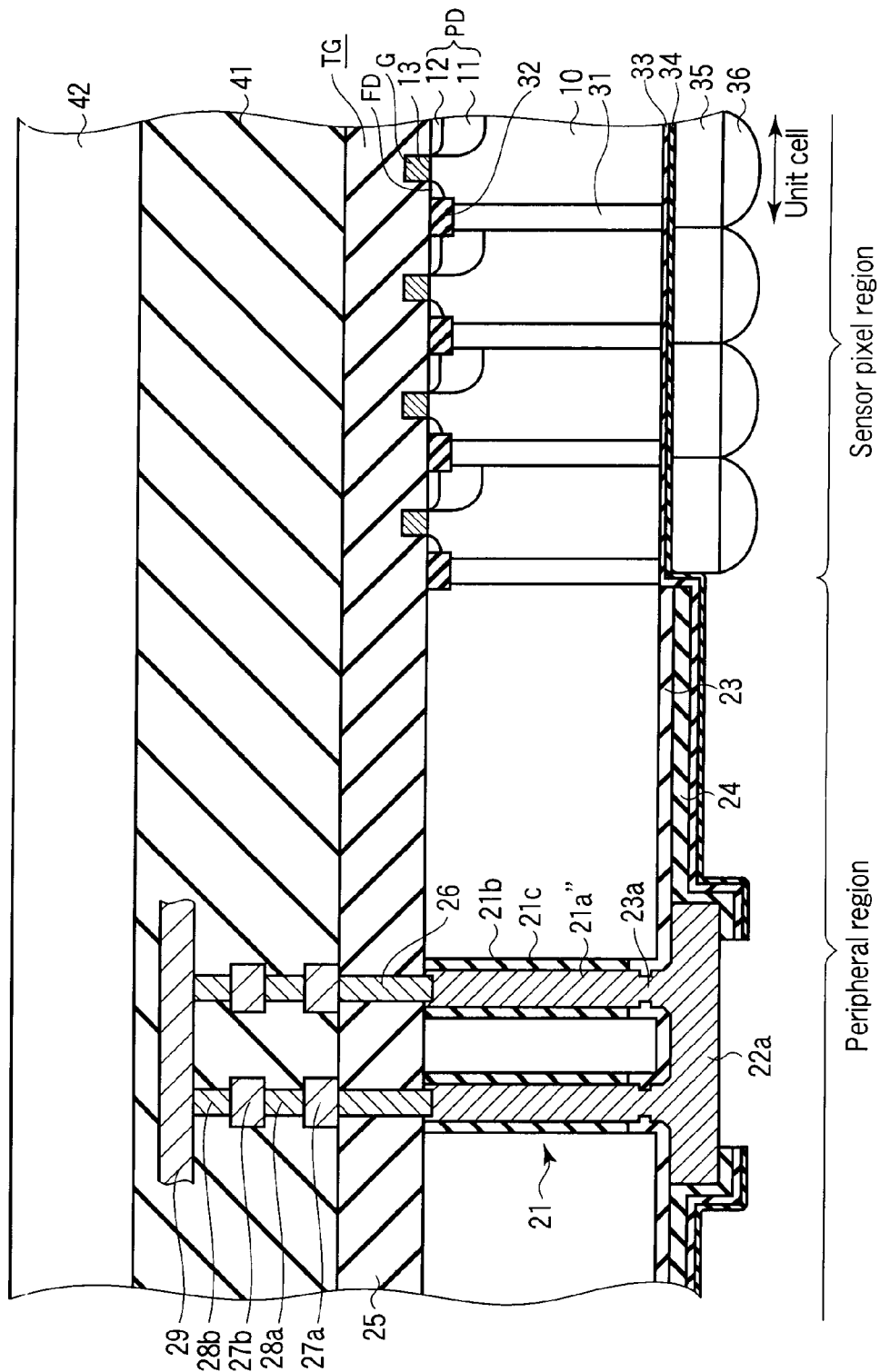
FIG. 31 is a cross-sectional view showing a configuration example of a semiconductor device (back side illumination CMOS image sensor) according to a third embodiment of the present invention.

FIG. 31 shows a configuration example of a semiconductor device according to a third embodiment of the present invention. Here, another example of the case where the parasitic resistance of a back side drawn electrode is configured to be reduced in a back side illumination CMOS image sensor will be described. It should be noted that the same parts as the first embodiment are denoted by the same reference symbols as the first embodiment, and a detailed description of them will be omitted.

That is, in a back side illumination CMOS image sensor of this embodiment, a contact layer 21a" of a back side drawn electrode 21 doubling as an alignment mark, and pad 22a are configured by using copper (Cu). The contact layer 21a" and pad 22a are simultaneously formed by, for example, an electric field plating method.

A method of manufacturing the back side illumination CMOS image sensor configured as described above will be described below. It should be noted that the process up to the step of forming the back side contact section 23a on the back side insulating film 23 is identical with the first embodiment, and hence the steps to be carried out thereafter will be described below.

Figure 32:
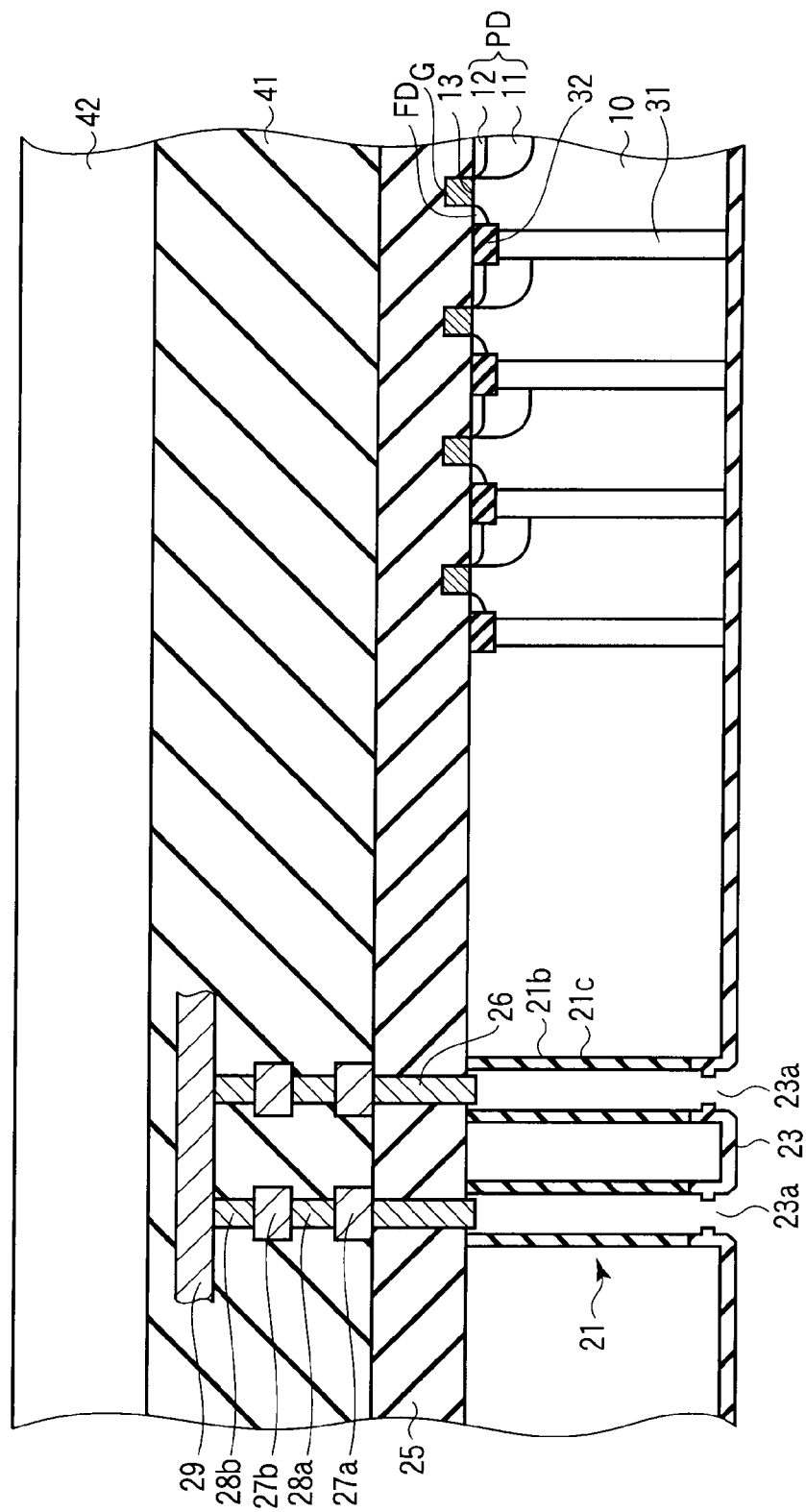
FIG. 32 is a process cross-sectional view shown to explain a method of manufacturing the CMOS image sensor according to the third embodiment.

First, in the state where the process up to the step of forming the back side contact section 23a on the back side insulating film 23 has been carried out (see FIGS. 3 to 15), as shown in, for example, FIG. 32, the low resistance polysilicon of each of the contact layers 21a is removed by etching.

Figure 33:
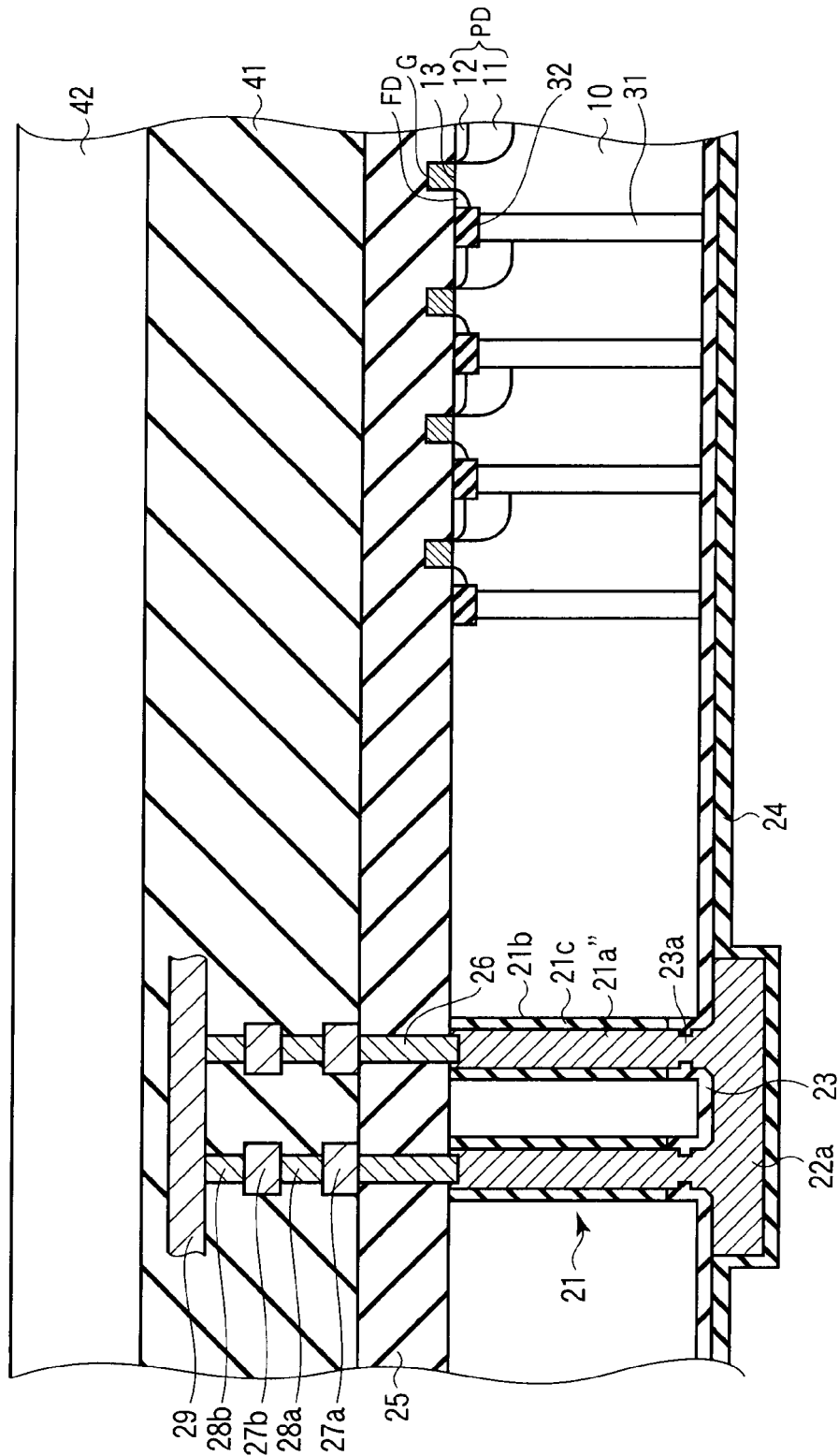
FIG. 33 is a process cross-sectional view shown to explain the method of manufacturing the CMOS image sensor according to the third embodiment.

Then, as shown in, for example, FIG. 33, Cu is embedded in each of the contact holes 21b by the electric field plating method to form contact layers 21a" and simultaneously form a pad 22a. As a result of this, back side drawn electrodes 21 including contact layers 21a" formed by embedding Cu in the contact holes 21b, and doubling as alignment marks are minutely formed. In this case, the parasitic resistance of the contact layer 21a" is smaller than the contact layers 21a and 21a'.

Further, after the back side drawn electrodes 21 are formed, a passivation insulating film 24 is further deposited on the pad 22a and back side insulating film 23.

Figure 34:
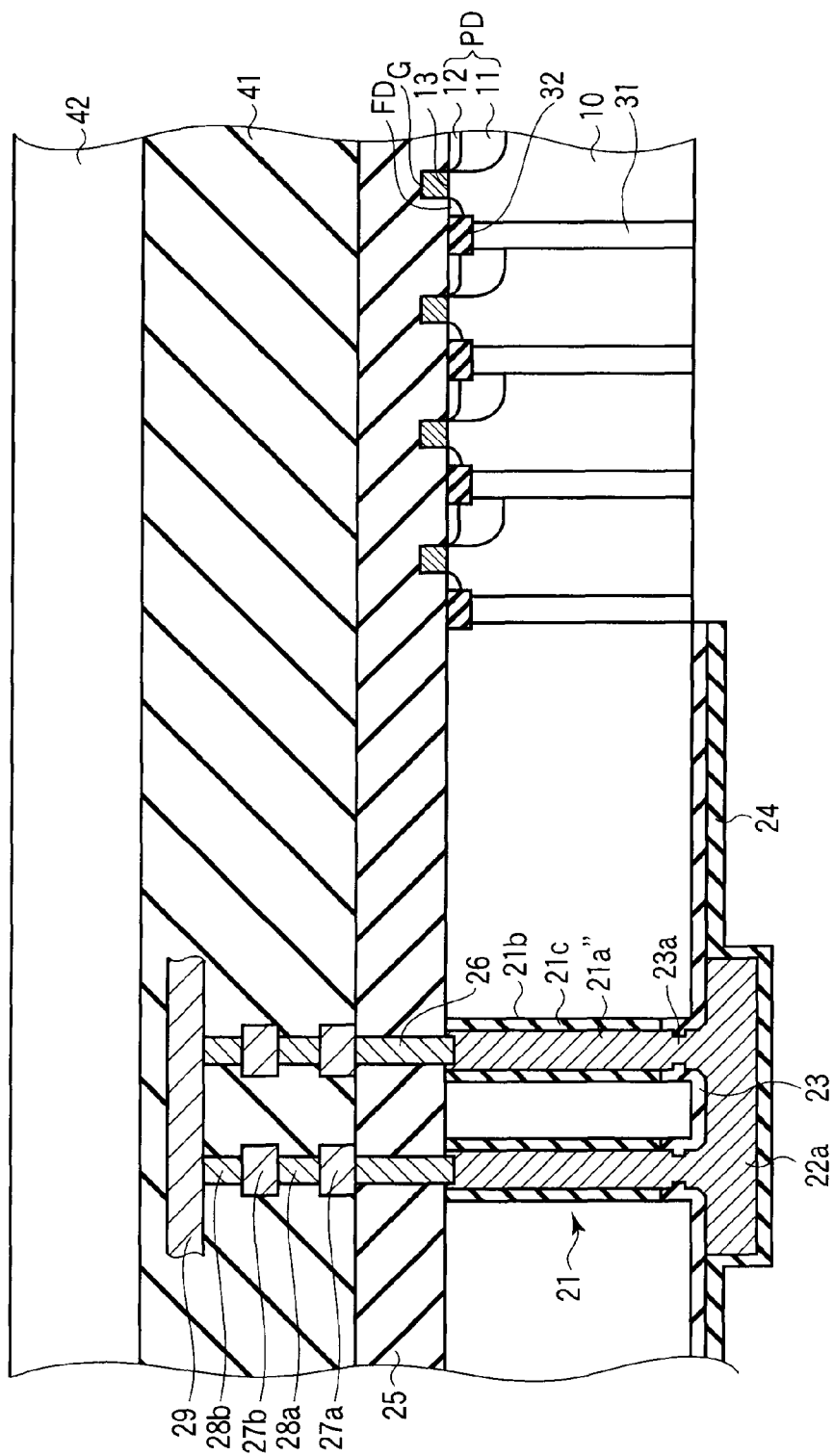
FIG. 34 is a process cross-sectional view shown to explain the method of manufacturing the CMOS image sensor according to the third embodiment.

Then, as shown in, for example, FIG. 34, part of each of the passivation insulating film 24, and back side insulating film 23 corresponding to the sensor pixel region is removed.

Figure 35:
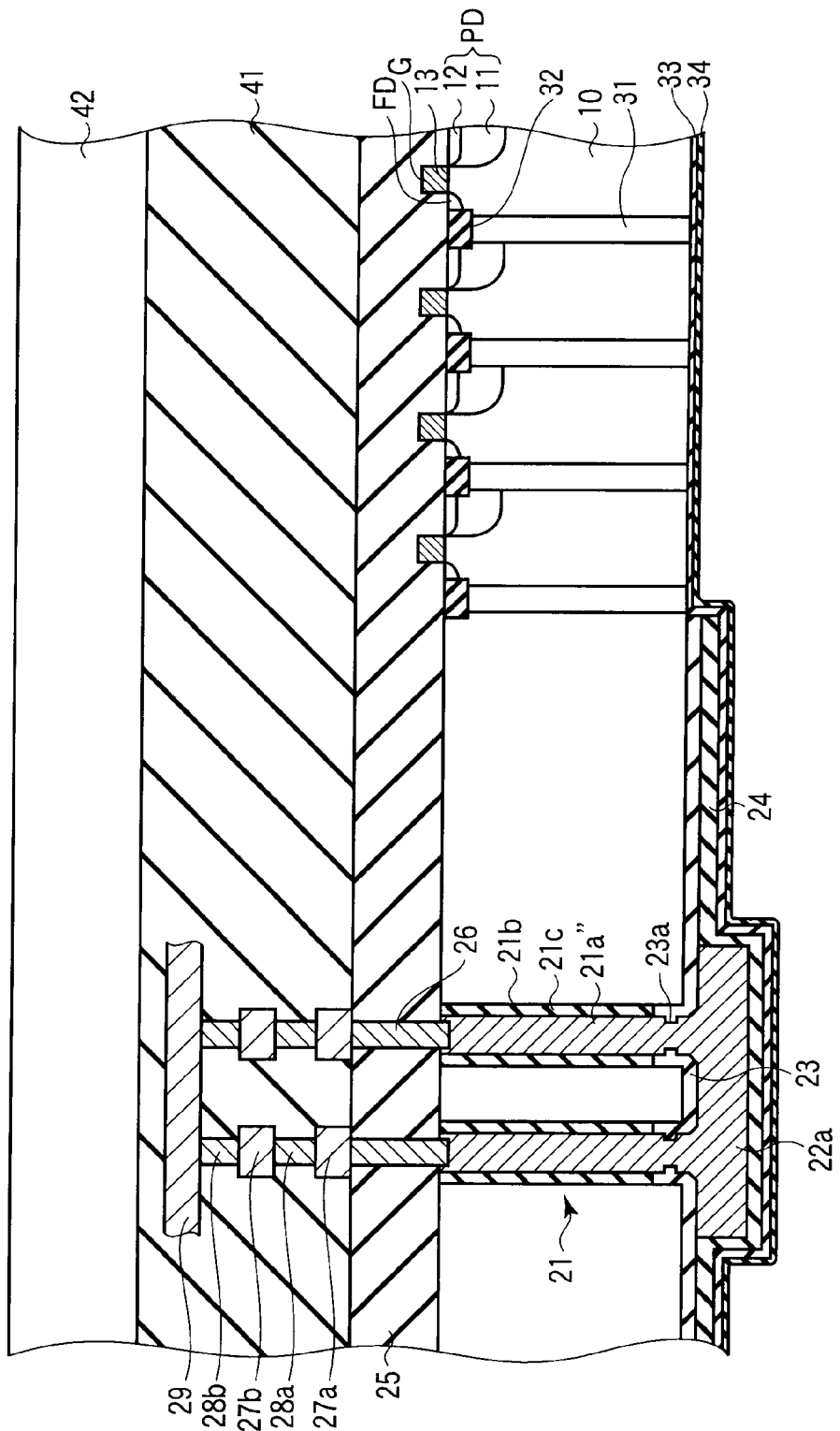
FIG. 35 is a process cross-sectional view shown to explain the method of manufacturing the CMOS image sensor according to the third embodiment.

Then, as shown in, for example, FIG. 35, a passivation oxide film 33 and passivation nitride film 34 are deposited to cover the exposed part of the Si epitaxial layer 10 in the sensor pixel region, and passivation insulating film 24 in the peripheral region.

Figure 36:
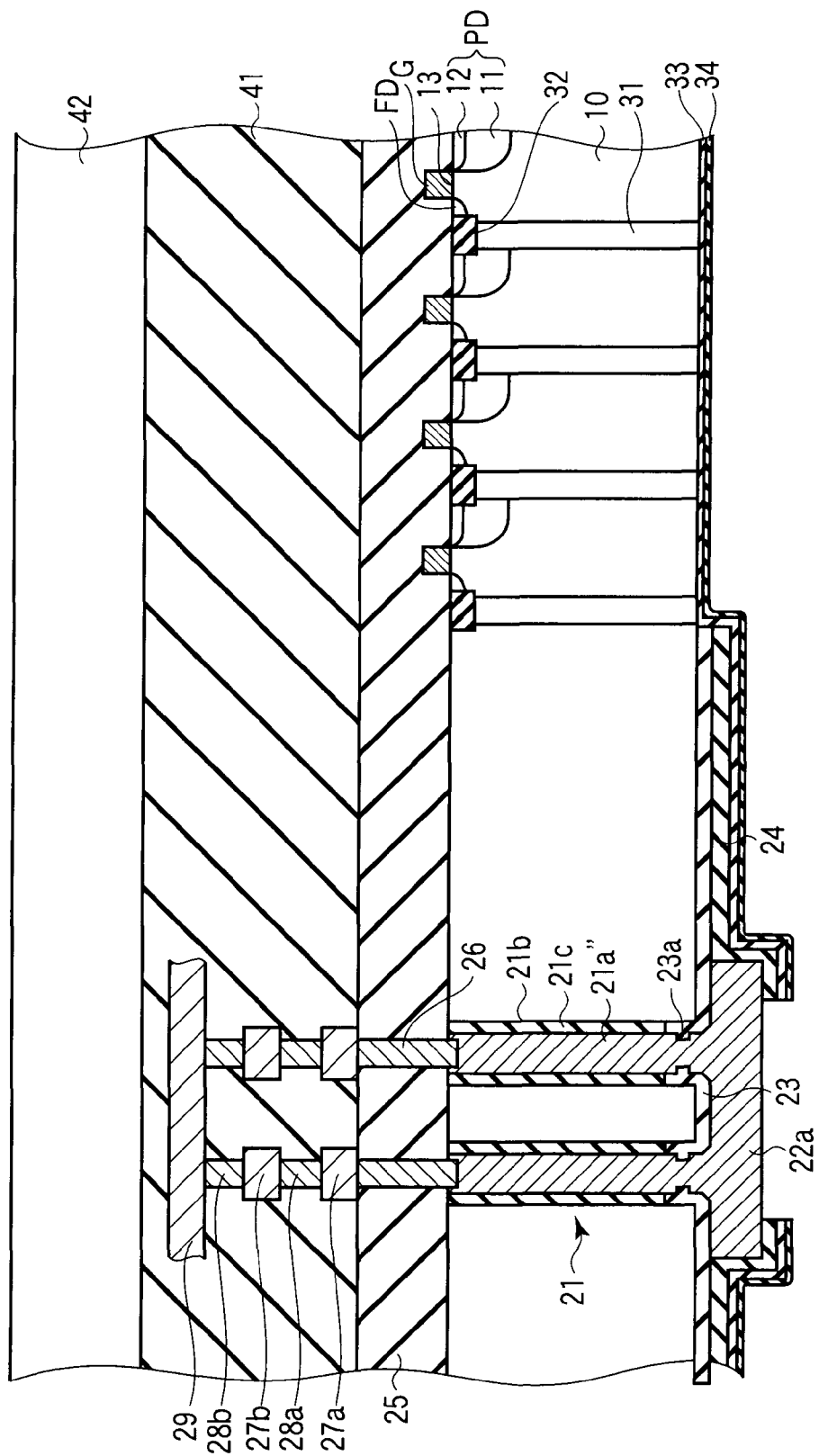
FIG. 36 is a process cross-sectional view shown to explain the method of manufacturing the CMOS image sensor according to the third embodiment.

Then, as shown in, for example, FIG. 36, part of each of the passivation insulating film 24, passivation oxide film 33, and passivation nitride film 34 is opened to expose the pad 22a from the opening part.

Finally, a color filter 35, and microlens 36 are formed on the back side of part of the Si epitaxial layer 10 corresponding to the sensor pixel region for each unit cell by utilizing the back side drawn electrode 21 as an alignment mark, whereby a back side illumination CMOS image sensor shown in, for example, FIG. 31 is completed.

In the case of this embodiment, in addition to the advantage (that the alignment mark can be miniaturized, and the back side illumination CMOS image sensor can be formed smaller in size), it is possible to largely reduce the parasitic resistance of the back side drawn electrode 21 by replacing the polysilicon serving as the contact layer of the back side drawn electrode 21 with Cu.

Further, it is possible to reduce the number of steps more than the case of the second embodiment by simultaneously forming the contact layers 21a" of the back side drawn electrodes 21, and pad 22a.

It should be noted that in each of the embodiments described above, a back side illumination CMOS image sensor has been described as an example. However, the present invention is not limited to this, and can be applied to various semiconductor devices configured in such a manner that, for example, an electrode is drawn out to the back side of the device.

Further, it goes without saying that the number of contact layers of back side drawn electrodes, arrangement of the contact layers, and the like are not limited to the configuration of each embodiment.

Furthermore, in forming the contact layer of the back side drawn electrode, it is also possible to carry out the replacement by using copper or the like in place of tungsten (second embodiment).

Particularly, in the second and third embodiments, it is also possible to carry out the formation of the contact layer by using tungsten, copper or the like without carrying out the replacement of the polysilicon. In this case, it becomes possible to reduce the number of steps.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a back side drawn electrode formed by embedding a first conductive material in a contact hole penetrating the semiconductor substrate through an insulating film formed to include a uniform thickness, used also as an alignment mark, and configured to draw out an electrode to the back side of the semiconductor substrate; and a pad provided on the back side of the semiconductor substrate, and connected to the back side drawn electrode, wherein the electrode includes a second conductive material having a resistance which is lower than that of the first conductive material.

2. The device of claim 1 further comprising a backside illumination CMOS image sensor in which a sensor section is provided on the surface side of the semiconductor substrate, and the backside illumination CMOS image sensor including lens formed by using the back side drawn electrode as the alignment mark is provided on the back side of the semiconductor substrate opposed to the surface side.

3. The device of claim 1, wherein each of the electrode and pad contains a third conductive material resistance of which is lower than the first conductive material.

4. The device of claim 3, wherein
the first conductive material is polysilicon to which impurities are added,
second conductive material is tungsten, and
third conductive material is copper.

5. The device of claim 1 further comprising a contact connected to the electrode.

6. The device of claim 5 further comprising:
wiring and vias of a plurality of layers electrically connected to the contact; and
a wiring layer electrically connected to the wiring and vias of the plurality of layers.

7. A method of manufacturing a semiconductor device configured to form a back side drawn electrode which is used to draw out an electrode used also as an alignment mark to the back side of a semiconductor substrate comprising:
forming a through hole in the semiconductor substrate;
forming an insulating film with a uniform thickness on an inner wall of the through hole; and
embedding a first conductive material in the through hole through the insulating film to thereby form a contact layer.

8. The method of claim 7 further comprising forming, after forming the contact layer, a back side illumination CMOS image sensor provided with a sensor section and a lens, the sensor section formed on the surface side of the semiconductor substrate, and the lens formed on the back side of the semiconductor substrate opposed to the surface side by using the back side drawn electrode as an alignment mark.

9. The method of claim 7, wherein forming the contact layer includes replacing the first conductive material embedded in the through hole with a second conductive material resistance of which is lower than the first conductive material.

10. The method of claim 7 wherein the forming the contact layer includes replacing the first conductive material embedded in the through hole with a second conductive material resistance of which is lower than the first conductive material, and
further comprising forming, by using the second conductive material, a pad connected to the contact layer on the back side of the semiconductor substrate.

11. The method of claim 10, wherein the contact layer and pad are simultaneously formed.

12. The method of claim 11, wherein simultaneously forming the contact layer and pad includes using a third conductive material resistance of which is lower than the first conductive material.

13. The method of claim 12, wherein
the first conductive material is polysilicon to which impurities are added,
second conductive material is tungsten, and
third conductive material is copper.

14. The method of claim 7, further comprising forming a contact electrically connected to the contact layer.

15. The method of claim 14, further comprising:
forming wiring and vias of a plurality of layers electrically connected to the contact; and
forming a wiring layer electrically connected to the wiring and vias of the plurality of layers.

* * * * *